(12) United States Patent
Ozeki et al.

(10) Patent No.: US 11,664,385 B2
(45) Date of Patent: May 30, 2023

(54) DISPLAY DEVICE

(71) Applicant: Japan Display Inc., Tokyo (JP)

(72) Inventors: Yoshitaka Ozeki, Tokyo (JP); Nobutaka Ozaki, Tokyo (JP); Koshiro Moriguchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/954,475

(22) Filed: Sep. 28, 2022

(65) Prior Publication Data
US 2023/0106954 A1   Apr. 6, 2023

(30) Foreign Application Priority Data

Oct. 5, 2021   (JP) .............................. JP2021-164270

(51) Int. Cl.
| | |
|---|---|
| *G02F 1/1343* | (2006.01) |
| *G02F 1/1362* | (2006.01) |
| *G02F 1/1333* | (2006.01) |
| *H01L 27/12* | (2006.01) |
| *G02F 1/1368* | (2006.01) |

(52) U.S. Cl.
CPC ........ *H01L 27/1225* (2013.01); *G02F 1/1368* (2013.01); *G02F 1/136213* (2013.01); *G02F 1/136227* (2013.01); *G02F 1/136286* (2013.01); *H01L 27/124* (2013.01); *G02F 1/133345* (2013.01); *G02F 1/133357* (2021.01); *G02F 1/134309* (2013.01)

(58) Field of Classification Search
CPC ............. G02F 1/1333; G02F 1/133345; G02F 1/133357; G02F 1/1343; G02F 1/134309; G02F 1/134318; G02F 1/134363; G02F 1/1362; G02F 1/136213; G02F 1/136227; G02F 1/136286; G02F 1/1368; H01L 27/1225; H01L 27/124
See application file for complete search history.

(56) References Cited

U.S. PATENT DOCUMENTS

| | | | |
|---|---|---|---|
| 2011/0058116 A1 | 3/2011 | Yamazaki et al. | |
| 2016/0054616 A1* | 2/2016 | Makiuchi ................ | G03F 7/039 349/138 |

FOREIGN PATENT DOCUMENTS

| | | |
|---|---|---|
| JP | 2014-146819 A | 8/2014 |
| JP | 2015-159315 A | 9/2015 |

* cited by examiner

*Primary Examiner* — Thoi V Duong
(74) *Attorney, Agent, or Firm* — K&L Gates LLP

(57) ABSTRACT

A display device includes a first transistor having an oxide semiconductor layer, a gate wiring opposite the oxide semiconductor layer, a gate insulating layer between the semiconductor layer and the gate wiring, a first insulating layer including at least one insulating layer having a first contact hole outside the gate wiring, a planarization film having a second contact hole overlapping the first contact hole, a first transparent conductive layer including an area overlapping the gate wiring, a second insulating layer covering a side of the second contact hole, a second transparent conductive layer in contact with the oxide semiconductor layer through the first and second contact hole, a first resin filling the first and second contact hole coated by the second transparent conductive layer, and a third transparent conductive layer on the second transparent conductive layer and the first resin.

12 Claims, 19 Drawing Sheets

DISPLAY DEVICE

CROSS-REFERENCE TO RELATED APPLICATIONS

This application claims the benefit of priority to Japanese Patent Application No. 2021-164270, filed on Oct. 5, 2021, the entire contents of which are incorporated herein by reference.

FIELD

An embodiment of the present invention relates to a display device. In particular, an embodiment of the present invention relates to a display device in which a transistor having an oxide semiconductor is used.

BACKGROUND

Conventionally, a display device with a structure having a transistor with low-temperature polysilicon as a channel in a pixel circuit of each pixel is known. In addition, although a pixel electrode is made of a light-transmitting conductive film in such a display device, it is not easy to form the pixel electrode because the connection resistance between low-temperature polysilicon and the pixel electrode having light transmittance becomes high when they are simply connected directly. Therefore, low-temperature polysilicon needs to be connected to a pixel electrode via a metal conductive layer. However, it could be a factor leading to a decrease in the aperture ratio of the pixel, depending on the position where the metal conductive layer is provided.

In recent years, the miniaturization of the size of respective pixels has advanced in accordance with the high definition of a display device. With the reduction in pixel size, although it is desirable to reduce a wiring width and a transistor size, it is not easy to design them smaller according to the reduction in pixel size. As a result, the area occupied by wiring and a transistor in a pixel becomes relatively large, and as an outcome, the aperture ratio of each pixel become small.

Therefore, even if the size of a transistor is small, using a transistor that uses an oxide semiconductor layer as a channel which can obtain sufficient characteristics for driving a pixel circuit as a pixel circuit of a transistor is being developed (for example, Japanese laid-open patent publication No. 2014-146819 and Japanese laid-open patent publication No. 2015-159315). In this type of display device, a pixel electrode as a transparent conductive layer and an oxide semiconductor layer can be directly connected via a contact hole and a metal layer for connecting is not required. Therefore, it is possible to suppress a decrease in the aperture ratio.

SUMMARY

A display device according to an embodiment of the present invention includes a first transistor having an oxide semiconductor layer, a gate wiring opposite the oxide semiconductor layer, a gate insulating layer between the semiconductor layer and the gate wiring, a first insulating layer including at least one insulating layer on the first transistor and having a first contact hole outside the gate wiring, a planarization film on the first insulating layer and having a second contact hole overlapping the first contact hole, a first transparent conductive layer on the planarization film and including an area overlapping the gate wiring, a second insulating layer on the first transparent conductive layer, the second insulating layer covering a side of the second contact hole, a second transparent conductive layer on the second insulating layer and in contact with the oxide semiconductor layer through the first and second contact hole, a first resin filling the first and second contact hole coated by the second transparent conductive layer, and a third transparent conductive layer on the second transparent conductive layer and the first resin.

DESCRIPTION OF EMBODIMENTS

Figure 1:
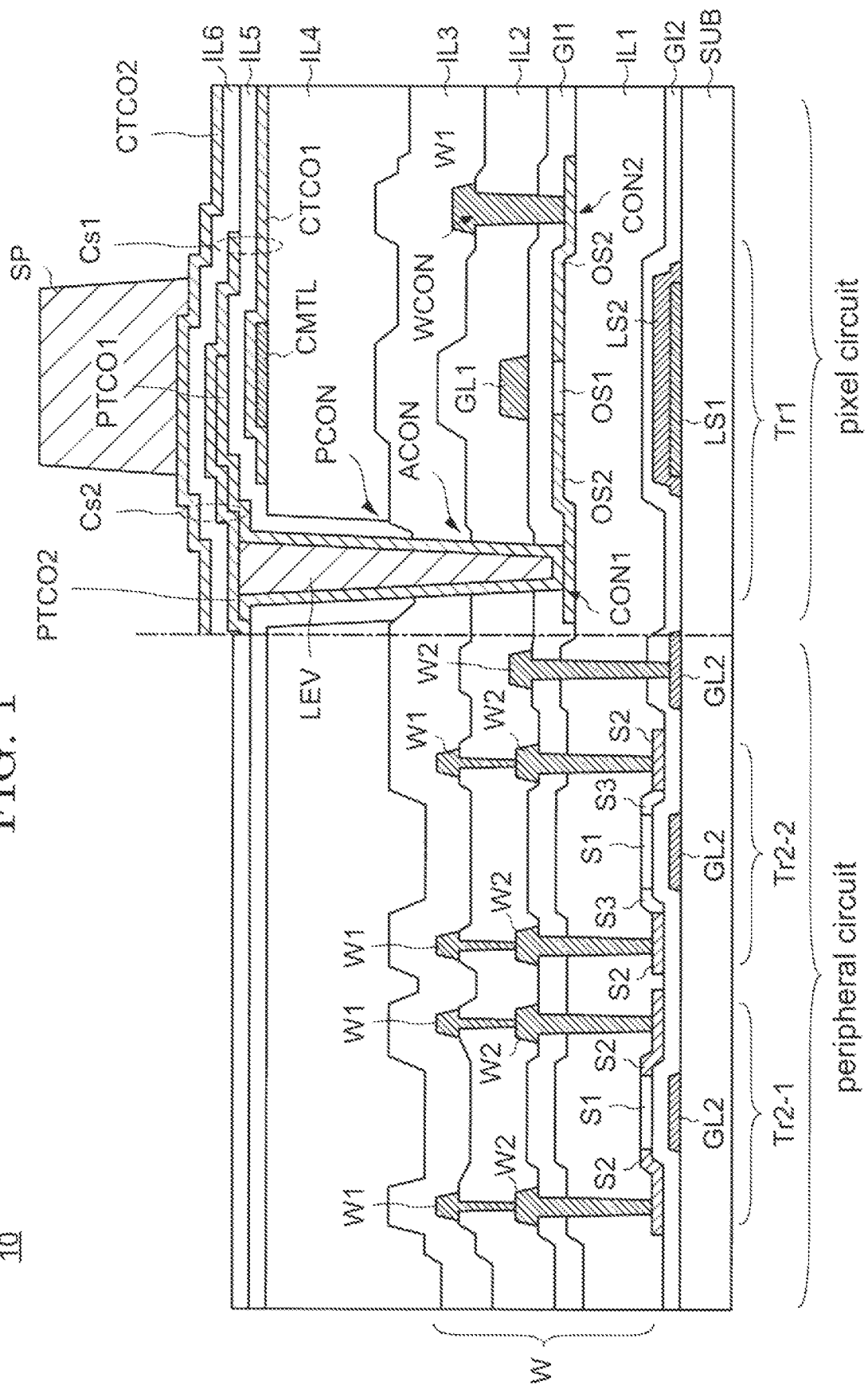
FIG. 1 is a cross-sectional view showing an outline of a display device according to an embodiment of the present invention.

Even if a transistor, in which an oxide semiconductor layer is used as a channel, is used for a transistor of a pixel circuit, if unevenness caused by a contact hole or the like is apparent in each pixel area, it becomes difficult to control liquid crystal molecules within the unevenness, and as an outcome, the improvement in the aperture ratio (transmittance) of the pixel is hindered.

One object of an embodiment of the present invention is to improve the aperture ratio of a miniaturized pixel in a display device.

Hereinafter, an embodiment of the present invention will be described with a reference to the drawings. The following disclosure is merely an example. A structure that can be easily conceived by a person skilled in the art by appropriately changing the structure of the embodiment while keeping the gist of the invention is naturally included in the scope of the present invention. In order to make the description clearer, the drawings may schematically show the width, thickness, shape, and the like of each part in comparison with an actual embodiment. However, illustrated shapes are merely examples, and do not limit the interpretation of the present invention. In the present specification and the drawings, elements similar to those described previously with respect to the described drawings are denoted by the same symbols, and a detailed description thereof may be omitted as appropriate.

In the embodiments of the present invention, the direction from a substrate toward an oxide semiconductor layer is referred to as above or upper direction. On the contrary, the direction from an oxide semiconductor layer to a substrate is referred to as below or lower direction. In this way, for convenience of explanation, the phrase "upper" or "lower" is used to describe the drawings. However, for example, a substrate and an oxide semiconductor layer may be arranged so that the upper and lower relationships are opposite to the drawing. In the following explanation, for example, the expression "oxide semiconductor layer on a substrate" merely describes the upper and lower relationship between a substrate and an oxide semiconductor layer as described above, and other members may be arranged between the substrate and the oxide semiconductor layer. The "upper" or "lower" means a stacking order in a structure in which a plurality of layers is stacked, and it may refer to a positional relationship in which the transistor and the pixel electrode do not overlap each other in a plan view when expressed as a pixel electrode above the transistor. On the other hand, when expressed as a pixel electrode vertically above the transistor, it means the positional relationship in which the transistor and the pixel electrode overlap in a plan view.

"Display device" refers to a structure that displays an image using an electro-optic layer. For example, the term display device may refer to a display panel that includes an electro-optic layer or may refer to a structure in which other optical members (e.g., polarized member, backlight, touch panel, etc.) are attached to a display cell. The "electro-optical layer" may include a liquid crystal layer, an electroluminescent (EL) layer, an electrochromic (EC) layer, or an electrophoretic layer, unless there is a technical inconsistency. Therefore, although a display device will be described by exemplifying a liquid crystal display device including a liquid crystal layer, the structure in the present embodiment can be applied to a display device including the other electro-optical layers described above.

In the present specification, expressions "a includes A, B, or C," "a includes any one of A, B, and C," and "a includes one selected from a group consisting of A, B, and C," do not exclude the case where a includes a plurality of combinations of A to C unless otherwise specified. Furthermore, these expressions do not exclude the case where a includes other elements.

In addition, the following embodiments can be combined with each other as long as there is no technical inconsistency.

1. First Embodiment

[1-1. Structure of Display Device 10]

A structure of a display device 10 according to an embodiment of the present invention will be described with reference to FIG. 1 to FIG. 16. FIG. 1 is a cross-sectional view showing an outline of a display device according to an embodiment of the present invention.

Figure 2:
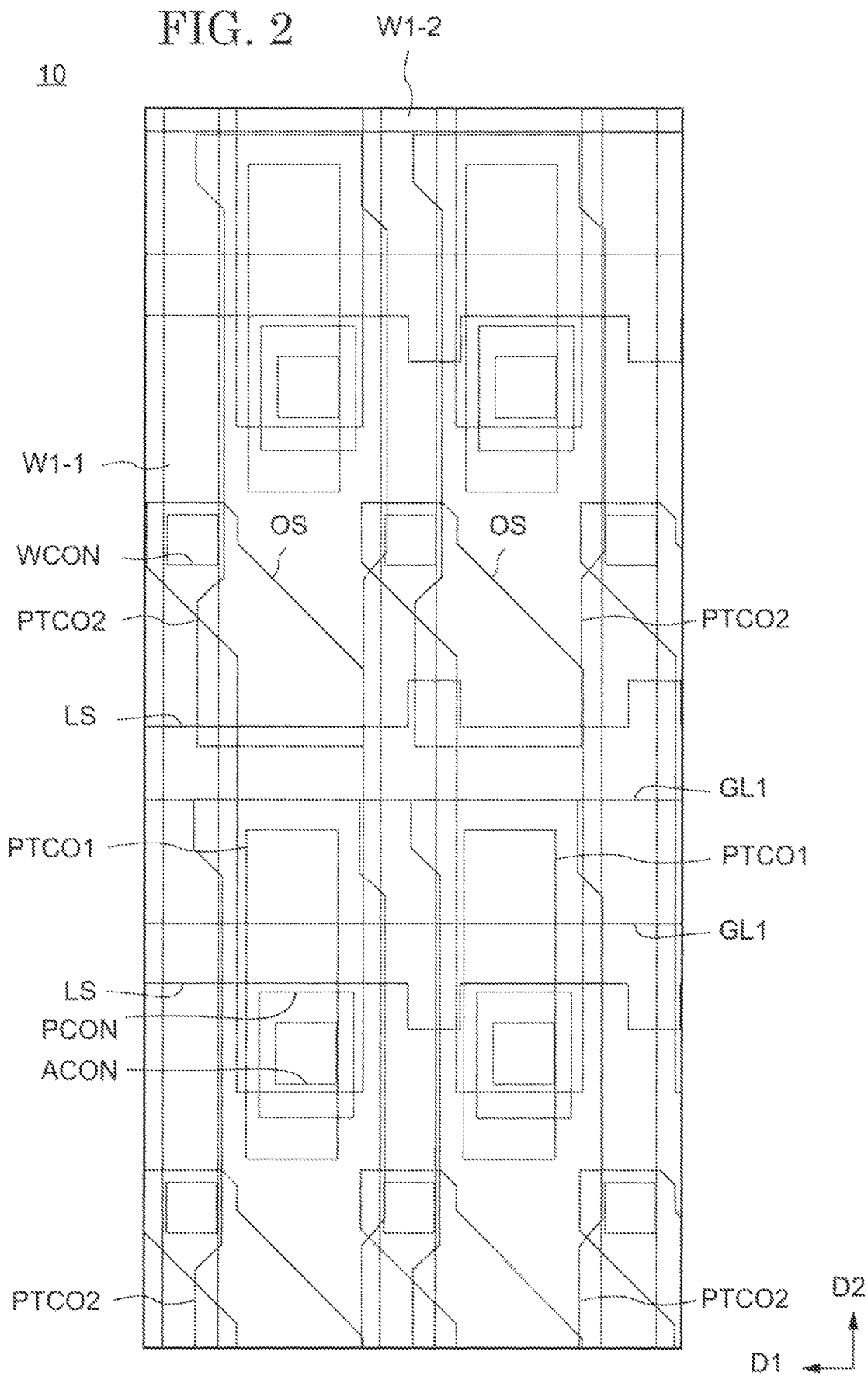
FIG. 2 is a plan view showing an outline of a display device according to an embodiment of the present invention.

As shown in FIG. 1, the display device 10 includes a substrate SUB, a transistor Tr1, a transistor Tr2, a wiring W, a pixel electrode PTCO1, a pixel electrode PTCO2, a common auxiliary electrode CMTL, a common electrode CTCO1, and a common electrode CTCO2. Also, TCO is an abbreviation for Transparent Conductive Oxide. The transistor Tr1 is a transistor included in a pixel circuit of the display device 10. The transistor Tr2 is a transistor included in a peripheral circuit. As will be described in detail later, the peripheral circuit is a circuit that drives the pixel circuit. The cross-sectional view of FIG. 1 is a diagram for explaining a layer structure of the display device 10, and the peripheral circuit and the pixel circuit are shown adjacently. In practice, the pixel circuit is provided in a display area, and the peripheral circuit is provided in a frame area outside the display area, and it is needless to say that these circuits are provided apart from each other. The display area is an area where pixels are used to form an image, i.e., an area that allows a user to recognize light from the pixel. In addition, in the pixel circuit in FIG. 1, a peripheral part of a contact hole in the pixel area is shown, and only a part of a transparent area (an opening area), which actually contributes to the display of an image, is shown. Also, the transparent area is shown in FIG. 2.

[1-2. Structure of Transistor Tr1]

The transistor Tr1 has an oxide semiconductor layer OS, a gate insulating layer GI1, and a gate electrode GL1 (also referred to as a gate wiring). The gate electrode GL1 faces the oxide semiconductor layer OS. The gate insulating layer GI1 is provided between the oxide semiconductor layer OS and the gate electrode GL1. In the present embodiment, although a top-gate transistor in which the oxide semiconductor layer OS is provided on the substrate SUB side closer than the gate electrode GL1 is shown, a bottom-gate transistor in which the positional relationship between the gate electrode GL1 and the oxide semiconductor layer OS is reversed may be used.

The oxide semiconductor layer OS includes an oxide semiconductor layer OS1 and an oxide semiconductor layer OS2. The oxide semiconductor layer OS1 is an oxide semiconductor layer in an area overlapping the gate electrode GL1 in a plan view. The oxide semiconductor layer OS1 functions as a semiconductor layer and is switched between a conductive state and a non-conductive state according to a voltage supplied to the gate electrode GL1. That is, the oxide semiconductor layer OS1 functions as forming a channel of the transistor Tr1. The oxide semiconductor layer OS2 functions as a conductive layer. The oxide semiconductor layer OS1 and the oxide semiconductor layer OS2 are layers formed from the same oxide semiconductor layer. For example, the oxide semiconductor layer OS2 is an oxide semiconductor layer whose resistance is reduced by doping a layer having the same physical property as the oxide semiconductor layer OS1 with an impurity.

An insulating layer IL2 is provided above the gate electrode GL1. A wiring W1 is provided above the insulating layer IL2. The wiring W1 is connected to the oxide semiconductor layer OS2 via an opening WCON (also referred to as a contact hole) provided in the insulating layer IL2 and the gate insulating layer GI1. An area of the oxide semiconductor layer OS2 that is in contact with the wiring W1 is referred to as a second contact area CON2. The wiring W1 is in contact with the oxide semiconductor layer OS2 in the second contact area CON2 that does not overlap the gate electrode GL1 in a plan view. A data signal related to the grayscale of the pixel is transmitted to the wiring W1. An insulating layer IL3 is provided above the insulating layer IL2 and the wiring W1. The gate insulating layer GI1, the insulating layer IL2, and the insulating layer IL3 are provided with an opening ACON (a first contact hole).

An insulating layer IL4 is provided above the insulating layer IL3. The insulating layer IL4 relieves a step formed by the structure provided below the insulating layer IL4. The insulating layer IL4 may be referred to as a planarization film. An opening PCON (also referred to as a second contact hole) is provided in the insulating layer IL4. The opening PCON is provided in a position that does not overlap the gate electrode GL1. The common auxiliary electrode CMTL is provided above the insulating layer IL4. The common electrode CTCO1 is provided above the common auxiliary electrode CMTL. As will be described later, the common auxiliary electrode CMTL and the common electrode CTCO1 have different plane patterns. The common auxiliary electrode CMTL is a metal layer. The electro resistance of the common auxiliary electrode CMTL is lower than that of the common electrode CTCO1. In addition, the common auxiliary electrode CMTL also functions as a light-shielding layer, and for example, it is possible to suppress the occurrence of color mixing by blocking the light from adjacent pixels.

An insulating layer IL5 is provided above the common electrode CTCO1. The insulating layer IL5 is also provided on a side wall of the opening PCON provided in the insulating layer IL4. The pixel electrode PTCO1 reaches the oxide semiconductor layer OS2 through peripheral walls of the opening ACON provided in the gate insulating layer GI1, the insulating layers IL2 and IL3, and the opening PCON provided in the insulating layer IL4, and is directly in contact with the semiconductor layer OS2. The opening ACON is provided inside the opening PCON. The pixel electrode PTCO1 is in contact with the insulating layer IL5 provided on the side wall of the opening PCON, the side walls of the insulating layers IL2 and IL3, and the side wall of the gate insulating layer GI1. In addition, an area in which the pixel electrode PTCO1 and the oxide semiconductor layer OS2 are in contact with each other is referred to as a first contact area CON1.

Here, for example, when a transparent conductive layer such as an ITO layer is formed in contact with a semiconductor layer such as a silicon layer, a surface of the semiconductor layer is oxidized by process gases and oxygen ions at the time of deposition of the ITO film. Since the oxide layer formed on the surface of the semiconductor layer has high resistance, the contact resistance between the semiconductor layer and the transparent conductive layer becomes high, causing electrical contact failure between the two. On the other hand, even if the transparent conductive layer is formed in contact with the oxide semiconductor layer, the high resistance oxide layer is not formed on the surface of the oxide semiconductor layer, and no electrical contact failure occurs between the oxide semiconductor layer and the transparent conductive layer.

The oxide semiconductor layer OS and the pixel electrode PTCO1 may be directly connected in the display device 10. The oxide semiconductor layer OS and the pixel electrode PTCO1 do not need to be connected via a metal conductive layer. Therefore, the aperture ratio of the pixel can be improved.

The peripheral walls of the opening ACON and the opening PCON are covered with the pixel electrode PTCO1 and filled with a resin layer LEV. Also, it is not necessary for the pixel electrode PTCO1 to completely cover the peripheral walls of the opening ACON and the opening PCON, and it is possible to adopt a structure in which they cover at least a part of them. It is possible to reduce a step formed by the opening ACON and the opening PCON by embedding the opening ACON and the opening PCON on the pixel electrode PTCO1 with the resin layer LEV. In addition, since the pixel electrode PTCO2 provided on the pixel electrode PTCO1 can be planarized, the switching of liquid crystal molecules can be stabilized. Furthermore, an insulating layer IL6 provided on the pixel electrode PTCO2 can be coated by suppressing the unevenness in thickness. In addition, it is possible to improve the transmittance because the transmittance loss in the opening PCON and the opening ACON can be reduced by using a resin having light transmittance as the resin layer LEV. In addition, it is possible to reduce the loss of light transmittance due to the difference in the refractive index of the resin layer LEV and the insulating layer IL4 by using the same material for the resin layer LEV and for the insulating layer IL4 or forming the refractive index of the resin layer LEV and the refractive index of the insulating layer IL4 substantially the same.

The pixel electrode PTCO2 is provided on the pixel electrode PTCO1 and the resin layer LEV. The pixel electrode PTCO2 is in contact with the pixel electrode PTCO1. The insulating layer IL6 is provided on the pixel electrode PTCO2. The common electrode CTCO2 is provided on the insulating layer IL6. A storage capacitor Cs1 can be configured by the common auxiliary electrode CMTL and the common electrode CTCO1, the insulating layer IL5, and the pixel electrodes PTCO1 and PTCO2.

The common electrode CTCO2 is provided on the insulating layer IL6. The common electrode CTCO2 is a transparent conductive layer. The common electrode CTCO2 is provided over the entire display area and is partially provided with an opening OP (not shown in FIG. 1). In addition, a storage capacitor Cs2 can be configured by the common electrode CTCO2, the insulating layer IL6, and the pixel electrodes PTCO1 and PTCO2. In a plan view, the common electrode CTCO2 has an area overlapping the common electrode CTCO1. In addition, the common electrode CTCO2 is electrically connected to the common electrode CTCO1 in a peripheral area.

A spacer SP is provided on the common electrode CTCO2. The spacer SP is provided in an area overlapping the common auxiliary electrode CMTL, the common electrode CTCO1, the pixel electrodes PTCO1 and PTCO2, and the common electrode CTCO2.

The spacer SP is provided for some pixels. For example, the spacer SP may be provided for any one of a blue pixel, a red pixel, and a green pixel. However, the spacers SP may be provided for all the pixels. The height of the spacer SP is half the height of a cell gap. Also, a spacer is also provided on a counter substrate, and the spacer of the counter substrate and the above-described spacer SP overlap in a plan view.

A light-shielding layer LS is provided between the transistor Tr1 and the substrate SUB. In the present embodiment, light-shielding layers LS1 and LS2 are provided as the light-shielding layer LS. However, the light-shielding layer LS may be formed only by the light-shielding layer LS1 or only by the light-shielding layer LS2. In a plan view, the light-shielding layer LS is provided in an area where the gate electrode GL1 and the oxide semiconductor layer OS overlap. In other words, the light-shielding layer LS is provided in an area overlapping the oxide semiconductor layer OS1 in a plan view. The light-shielding layer LS suppresses light entering from the substrate SUB side from reaching the oxide semiconductor layer OS1. When a conductive layer is used as the light-shielding layer LS, the oxide semiconductor layer OS1 may be controlled by applying a voltage to the light-shielding layer LS. When a voltage is applied to the light-shielding layer LS, the light-shielding layer LS and the gate electrode GL1 may be connected at a peripheral area of the pixel circuit. Also, in a plan view, the second contact area CON2 and the first contact area CON1 are provided in an area that does not overlap the light-shielding layer LS and the gate electrode GL1. In addition, in a plan view, the spacers SP overlap the gate electrode GL1 and the light-shielding layer LS1.

[1-3. Structure of Transistor Tr2]

The transistor Tr2 includes a p-type transistor Tr2-1 and an n-type transistor Tr2-2.

Each of the p-type transistor Tr2-1 and the n-type transistor Tr2-2 includes a gate electrode GL2 (also referred to as a gate wiring), a gate insulating layer GI2, and a semiconductor layer S. The gate electrode GL2 faces the semiconductor layer S. The gate insulating layer GI2 is provided between the semiconductor layer S and the gate electrode GL2. In the present embodiment, although a bottom-gate transistor in which the gate electrode GL2 is provided on the substrate SUB side closer than the semiconductor layer S is exemplified, a top-gate transistor in which the positional relationship between the semiconductor layer S and the gate electrode GL2 is reversed may be used.

The semiconductor layer S of the p-type transistor Tr2-1 includes semiconductor areas S1 and S2. The semiconductor layer S of the n-type transistor Tr2-2 includes the semiconductor areas S1, S2, and S3. The semiconductor area 51 is an area overlapping the gate electrode GL2 in a plan view. The semiconductor area 51 functions as a channel of the transistor Tr2-1. The semiconductor area S2 functions as a conductive area. The semiconductor area S3 functions as a conductive area having a higher resistance than the semiconductor area S2. The semiconductor area S3 suppresses hot carrier degradation by attenuating hot carriers entering toward the semiconductor layer 51.

An insulating layer IL1 and the gate insulating layer GI1 are provided above the semiconductor layer S. The gate insulating layer GI1 simply functions as an interlayer film in the transistor Tr2. A wiring W2 is provided above these insulating layers. The wiring W2 is connected to the semiconductor layer S via an opening provided in the insulating layer IL1 and the gate insulating layer GI1. The insulating layer IL2 is provided above the wiring W2. The wiring W1 is provided above the insulating layer IL2. The wiring W1 is connected to the wiring W2 via the opening WCON provided in the insulating layer IL2.

The gate electrode GL2 and the light-shielding layer LS2 are the same layer. The wiring W2 and the gate electrode GL1 are the same layer. In this case, the same layer means that a plurality of members is formed by patterning as a single layer.

[1-4. Plan Layout of Display Device 10]

A plan layout of the pixels of the display device 10 will be described with reference to FIG. 2 to FIG. 15. The common auxiliary electrode CMTL, the common electrodes CTCO1 and CTCO2, and the spacer SP are omitted in FIG. 2. The plan layouts of the common auxiliary electrode CMTL and the common electrodes CTCO1 and CTCO2 are shown in FIG. 12 to FIG. 15, respectively. In addition, the gate insulating layer GI1 and the insulating layer IL1 to the insulating layer IL6 in FIG. 2 to FIG. 15 indicate positions where the opening is provided.

Figure 3:
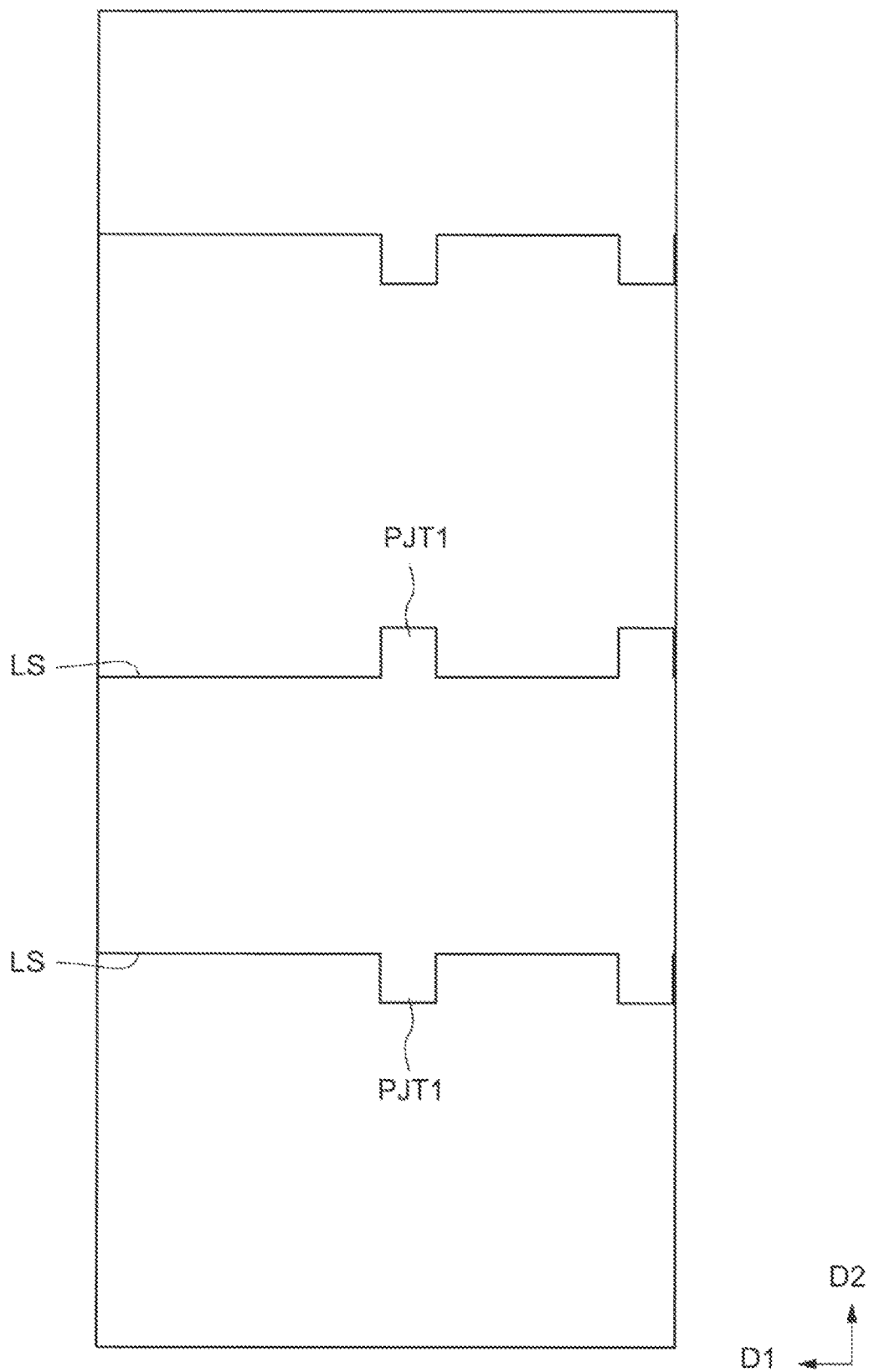
FIG. 3 is a plan view illustrating a layout of each layer in a display device according to an embodiment of the present invention.

As shown in FIG. 2 and FIG. 3, the light-shielding layer LS extends to a first direction D1. The light-shielding layer LS may have different shapes depending on the pixels. In the present embodiment, a projection portion PJT protruding in a second direction D2 from a part of the light-shielding layer LS extending in the first direction D1 is provided.

Figure 4:
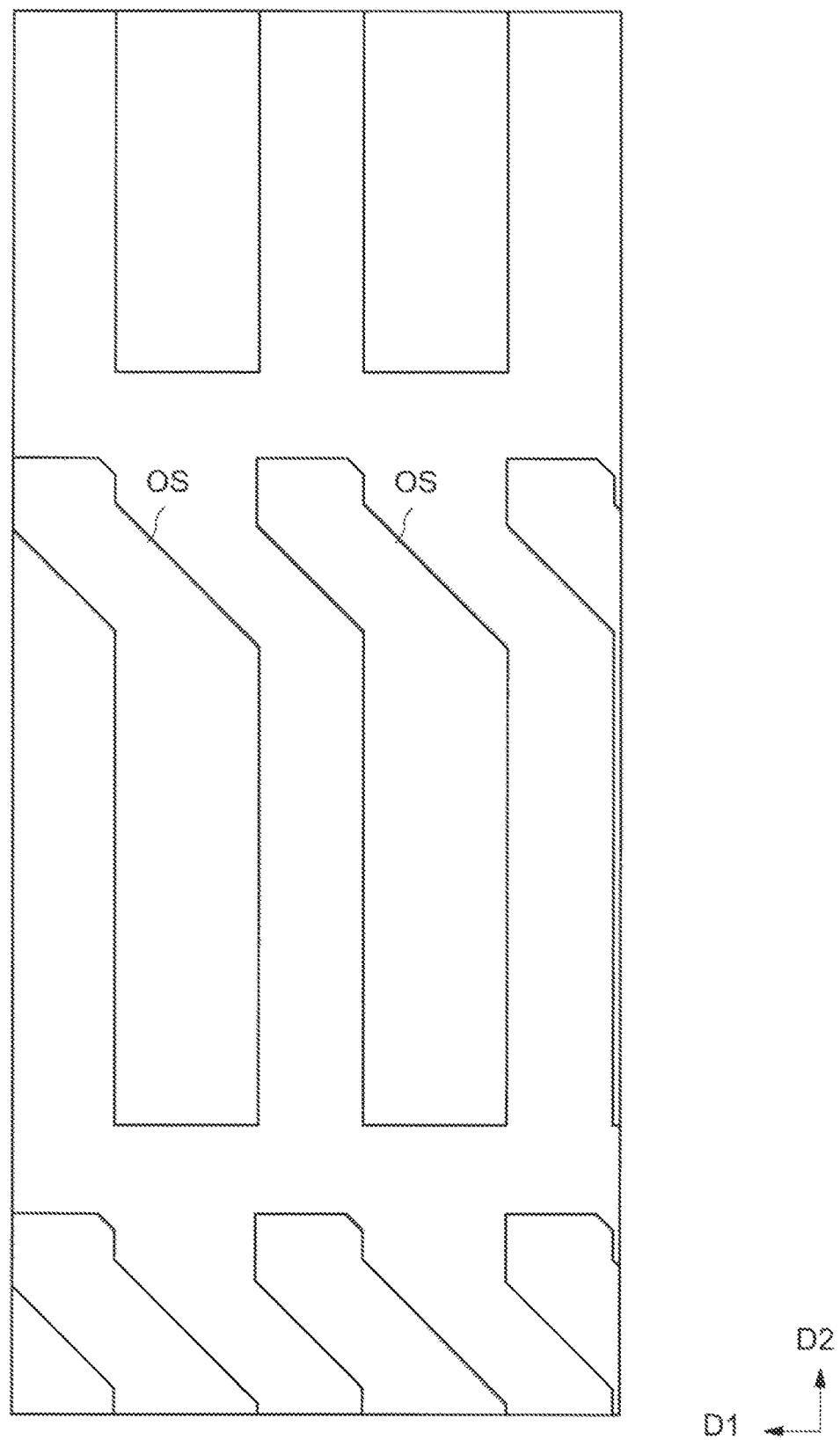
FIG. 4 is a plan view illustrating a layout of each layer in a display device according to an embodiment of the present invention.

As shown in FIG. 2 and FIG. 4, the oxide semiconductor layer OS extends in the second direction D2. The gate electrode GL1 extends in the first direction D1 so as to intersect the oxide semiconductor layer OS.

Figure 5:
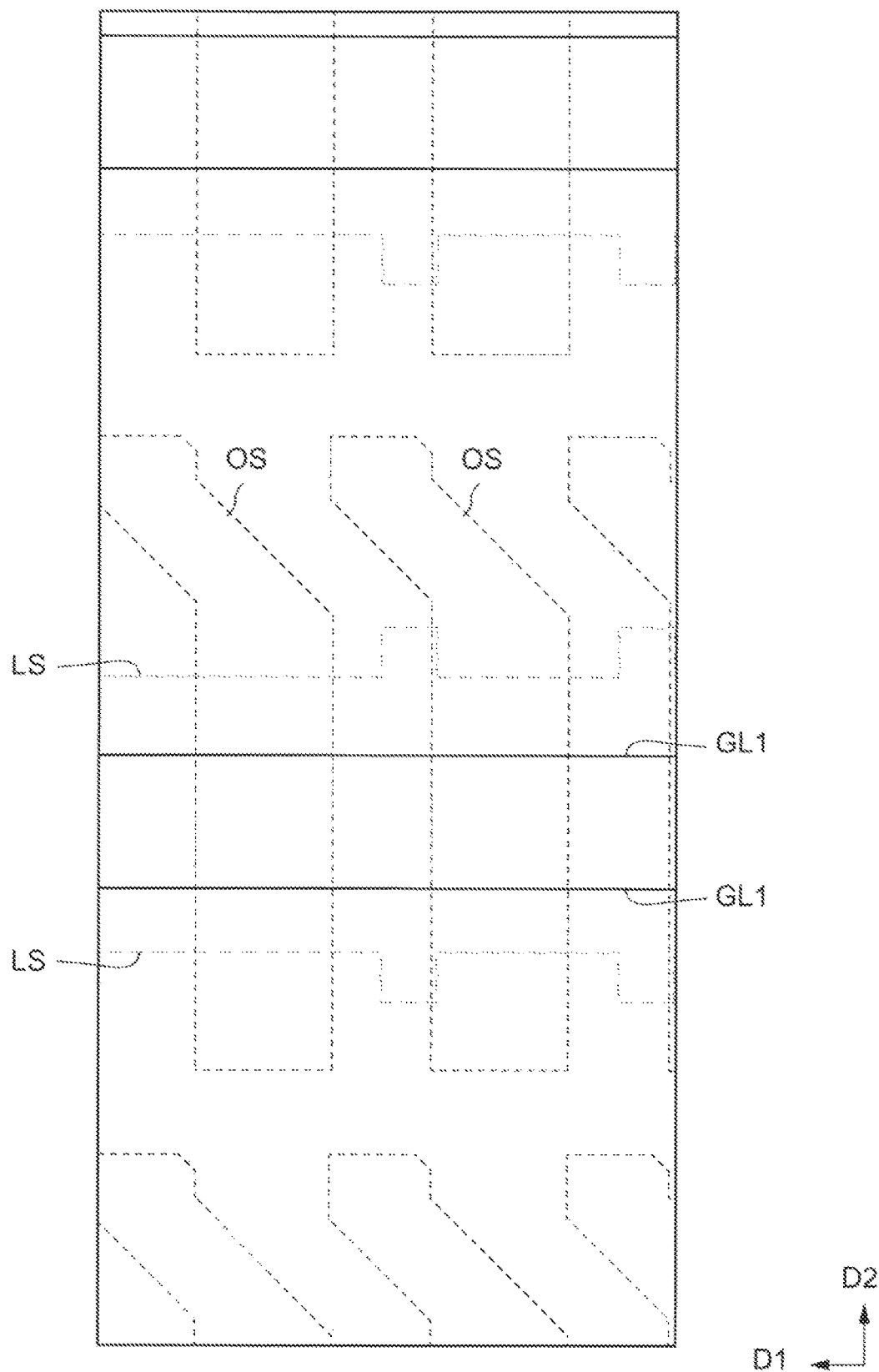
FIG. 5 is a plan view illustrating a layout of each layer in a display device according to an embodiment of the present invention.

As shown in FIG. 2 and FIG. 5, the pattern of the gate electrode GL1 is provided inside the pattern of the light-shielding layer LS. As shown in FIG. 5, the light-shielding layer LS is provided so as to include an area where the gate electrode GL1 and the oxide semiconductor layer OS overlap in a plan view. The gate electrode GL1 is also referred to as "gate wiring".

Figure 6:
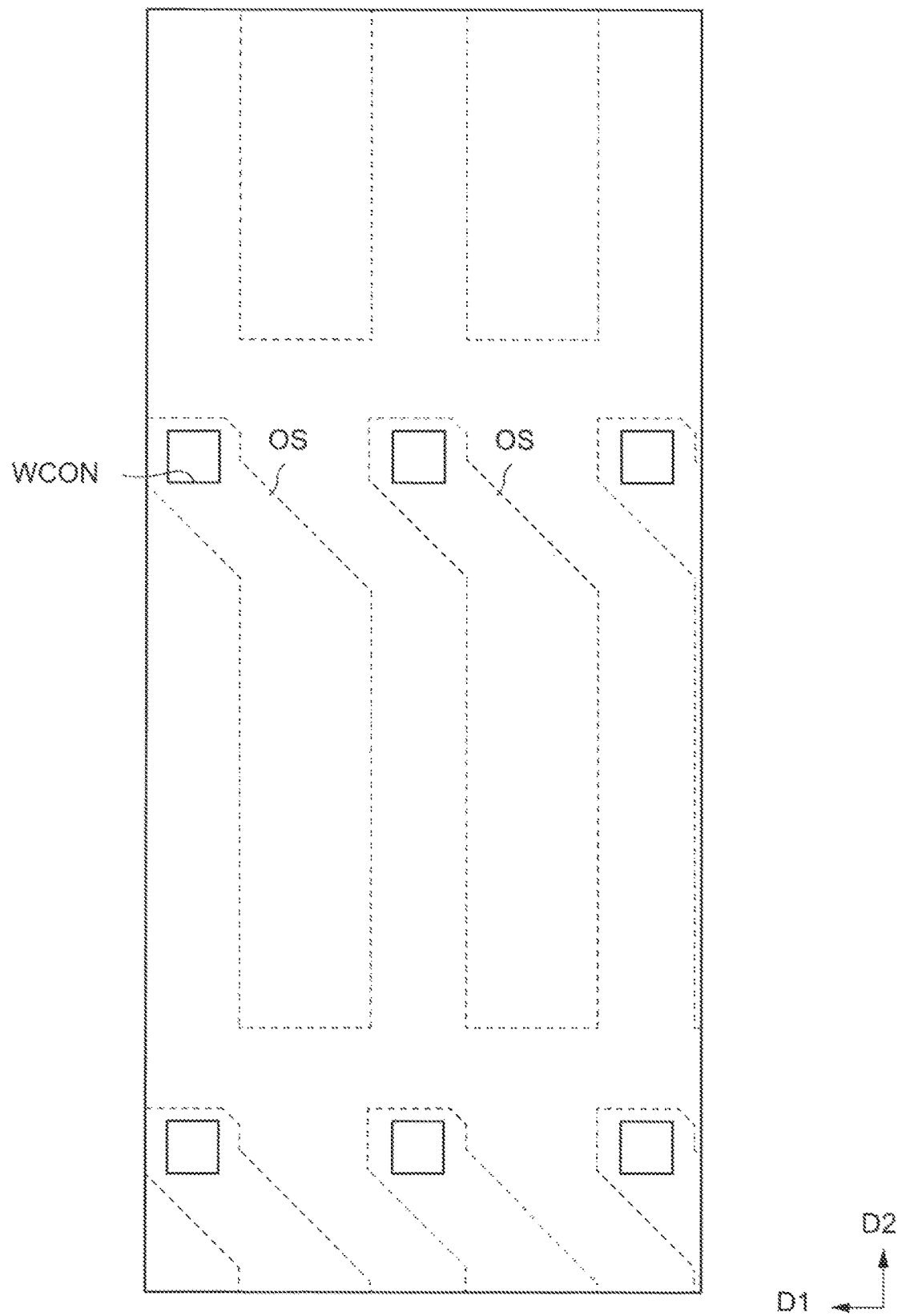
FIG. 6 is a plan view illustrating a layout of each layer a display device according to an embodiment of the present invention.

As shown in FIG. 2 and FIG. 6, the opening WCON is provided near an upper end of the pattern of the oxide semiconductor layer OS in FIG. 6. The opening WCON is provided in the gate insulating layer GI1 and the insulating layer IL2. The opening WCON is provided in an area overlapping the oxide semiconductor layer OS and in an area that does not overlap the gate electrode GL1.

Figure 7:
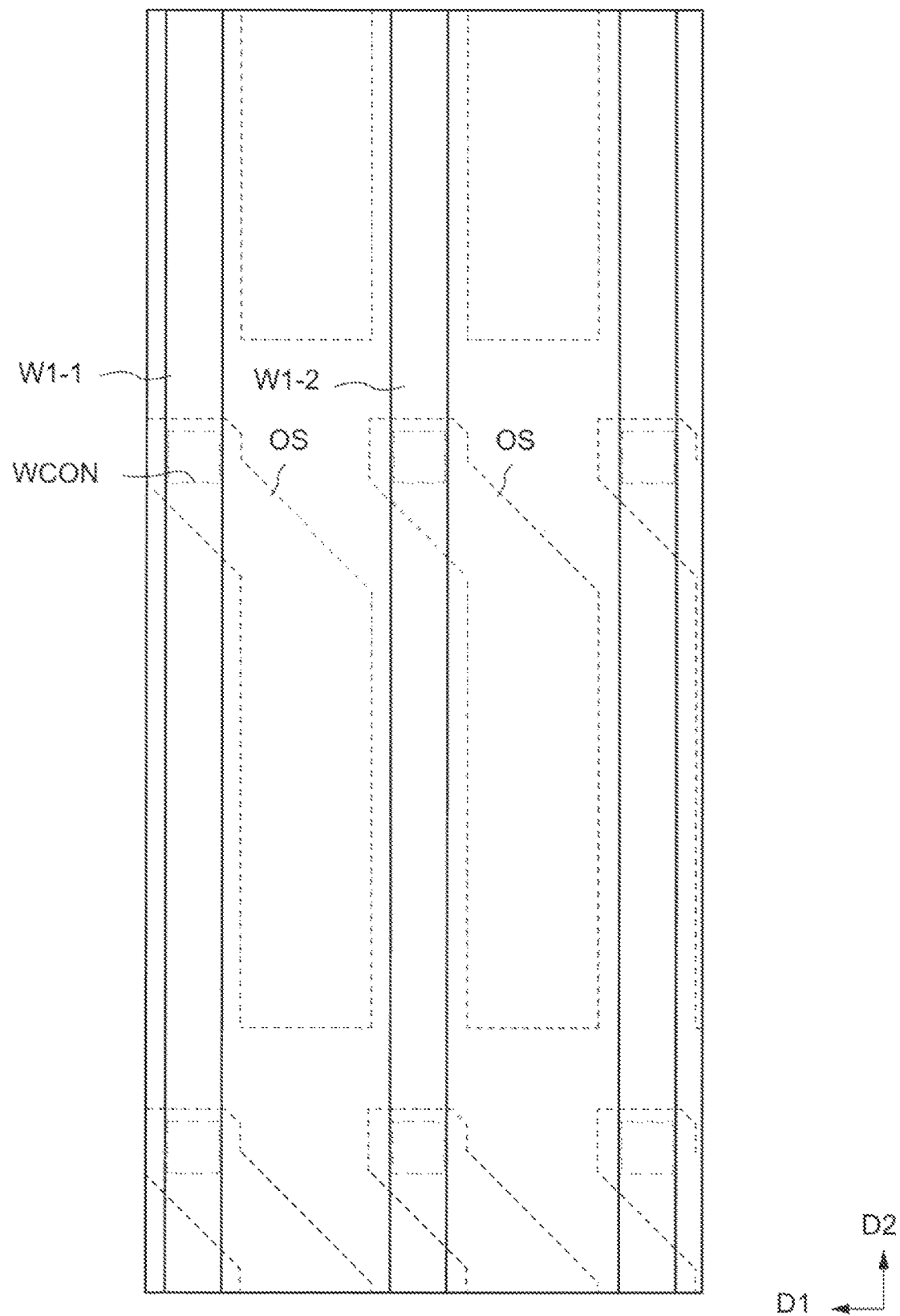
FIG. 7 is a plan view illustrating a layout of each layer in a display device according to an embodiment of the present invention.

As shown in FIG. 2 and FIG. 7, a plurality of wirings W1 extends in the second direction D2. The wiring W1 is provided in an area (the second contact area CON2) overlapping the oxide semiconductor layer OS in the opening WCON. When adjacent wirings need to be described separately, the adjacent wiring W1 is referred to as a wiring W1-1 (first wiring) and a wiring W1-2 (second wiring). In this case, the main part of the oxide semiconductor layer OS extends in the second direction D2 between the wiring W1-1 and the wiring W1-2 and intersects the gate electrode GL1. The main part of the pattern of the oxide semiconductor layer OS extends in the second direction D2 between the adjacent wirings W1. In addition, the remaining part of the pattern of the oxide semiconductor layer OS extends from the main part toward the area of the opening WCON in a direction oblique to the first direction D1 and the second direction D2.

Figure 8:
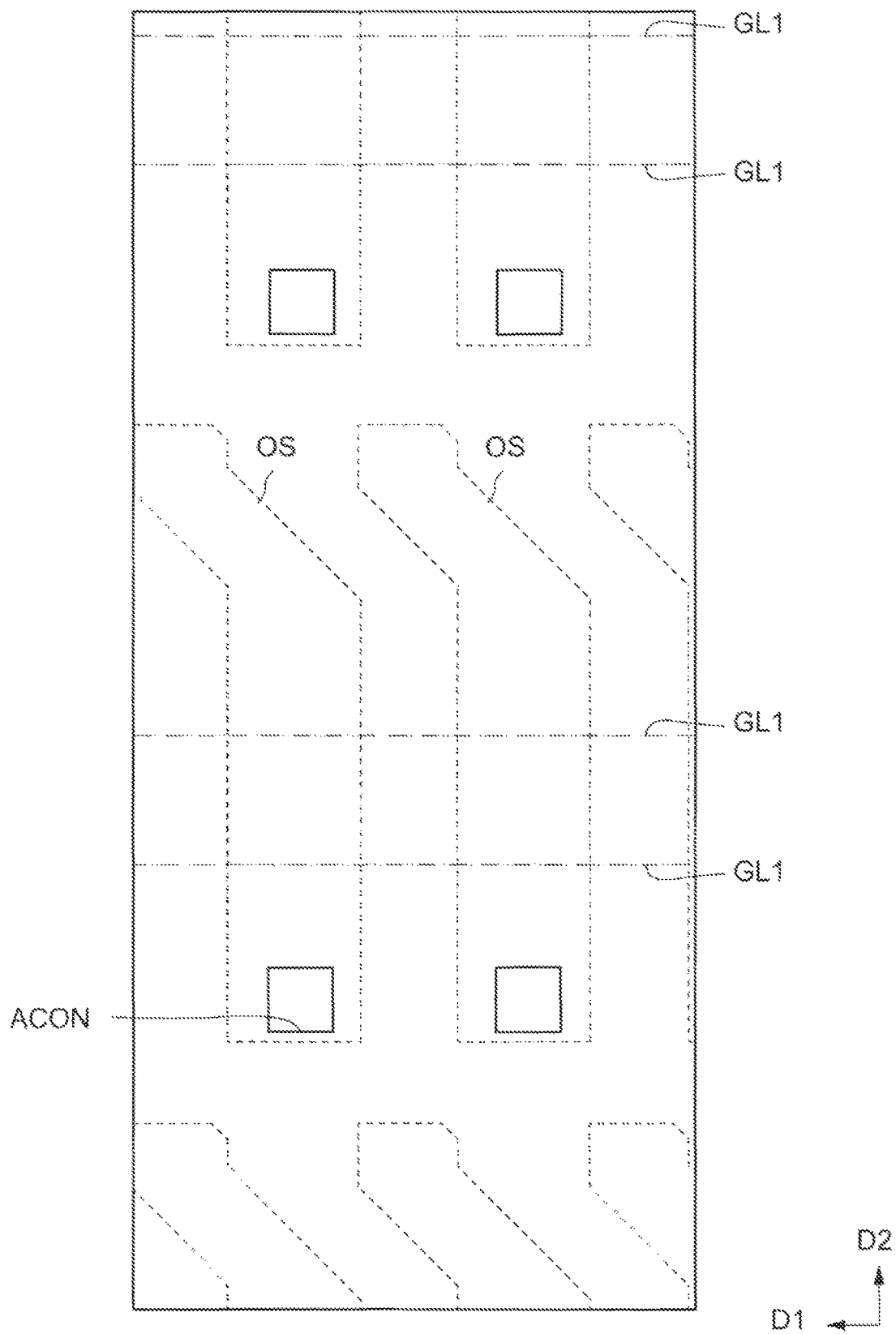
FIG. 8 is a plan view illustrating a layout of each layer in a display device according to an embodiment of the present invention.

As shown in FIG. 2 and FIG. 8, the opening ACON is provided in the vicinity of a lower end of the oxide semiconductor layer OS in FIG. 8. The opening ACON is provided in the gate insulating layer GI1 and the insulating layers IL2 and IL3. The opening ACON is provided in an area overlapping the oxide semiconductor layer OS and in an area that does not overlap the gate electrode GL1.

Figure 9:
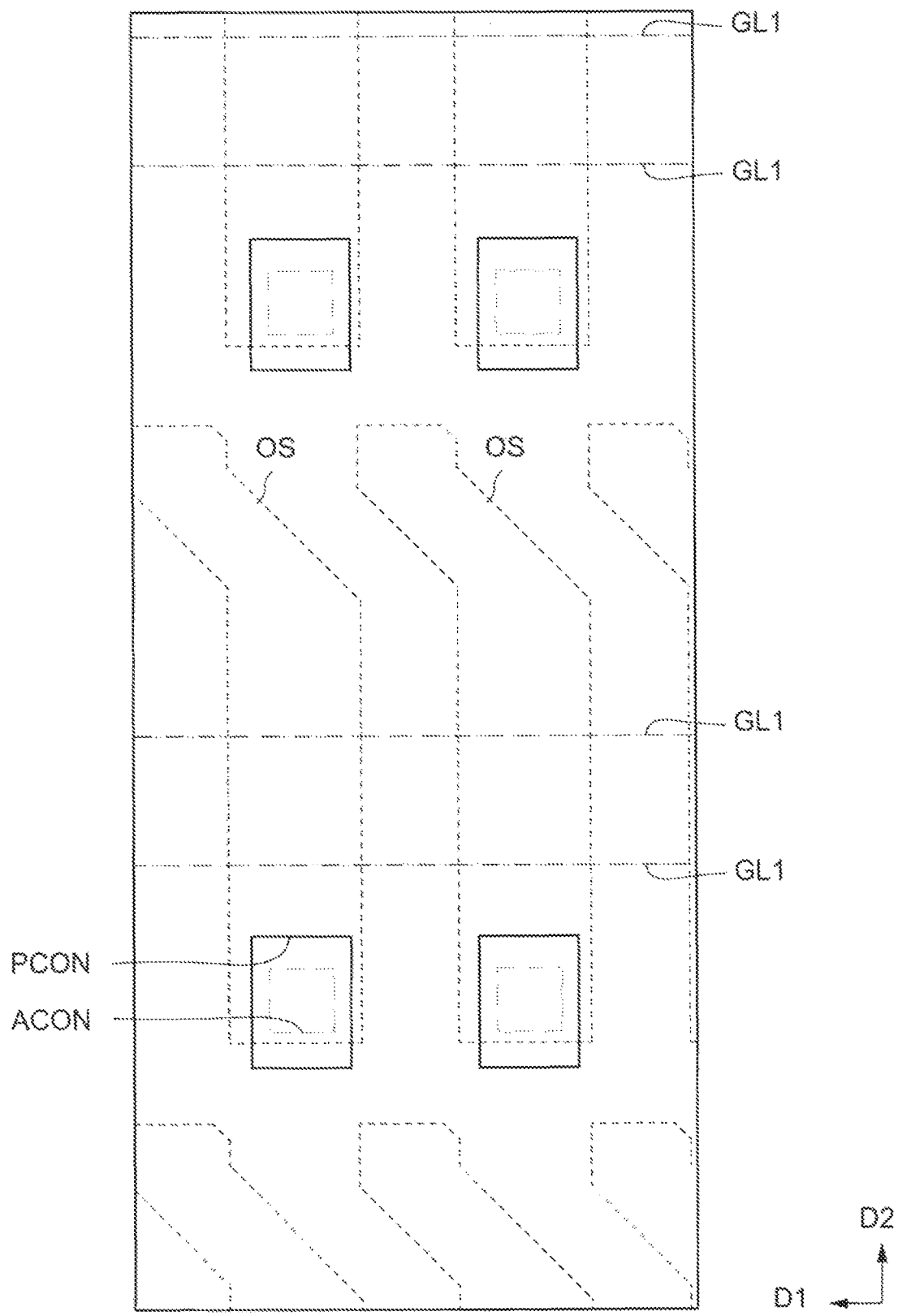
FIG. 9 is a plan view illustrating a layout of each layer in a display device according to an embodiment of the present invention.

As shown in FIG. 2 and FIG. 9, the opening PCON is provided in the vicinity of a lower end of the oxide semiconductor layer OS in FIG. 9. The opening PCON is provided in the insulating layer IL4. In addition, the opening PCON is provided overlapping the opening ACON. In other words, the opening ACON is provided inside the opening PCON.

Figure 10:
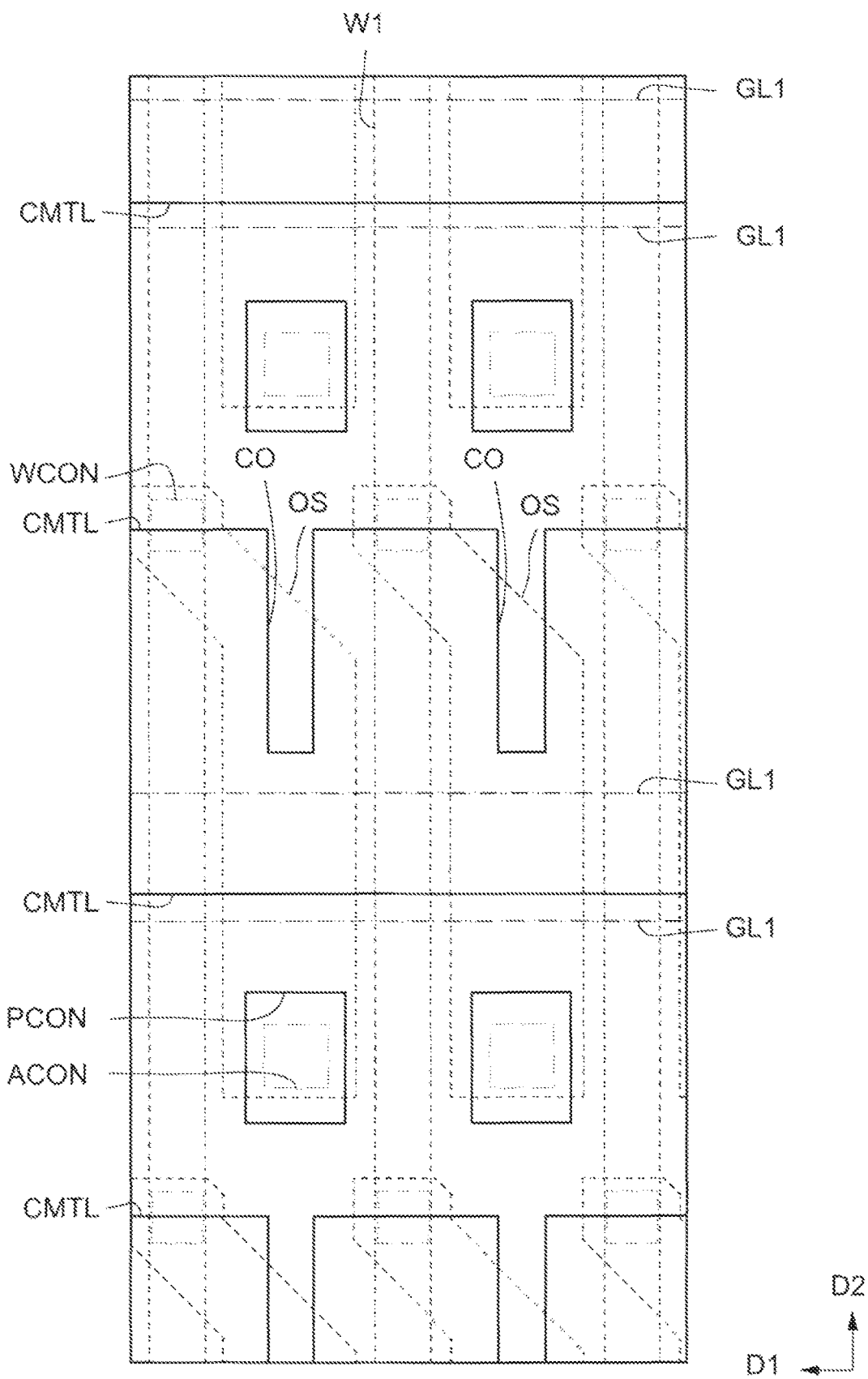
FIG. 10 is a plan view illustrating a layout of each layer in a display device according to an embodiment of the present invention.

As shown in FIG. 10, the common auxiliary electrode CMTL extends along the first direction D1 and has a portion overlapping the gate electrode GL1. In addition, the common auxiliary electrode CMTL has a part that is provided overlapping the wiring W1 along the second direction D2. Although an example in which the common auxiliary electrode CMTL is not connected to the adjacent common auxiliary electrode CMTL in the second direction D2 is shown, it is not limited to this. The common auxiliary electrode CMTL may be connected to the adjacent common auxiliary electrode CMTL in the second direction D2. In addition, a notch portion CO extending from one end of each common auxiliary electrode CMTL toward the center of the pixel along the D2 direction is provided. The common auxiliary electrode CMTL overlaps the wiring W1 and overlaps at least a part of the opening WCON.

Figure 11:
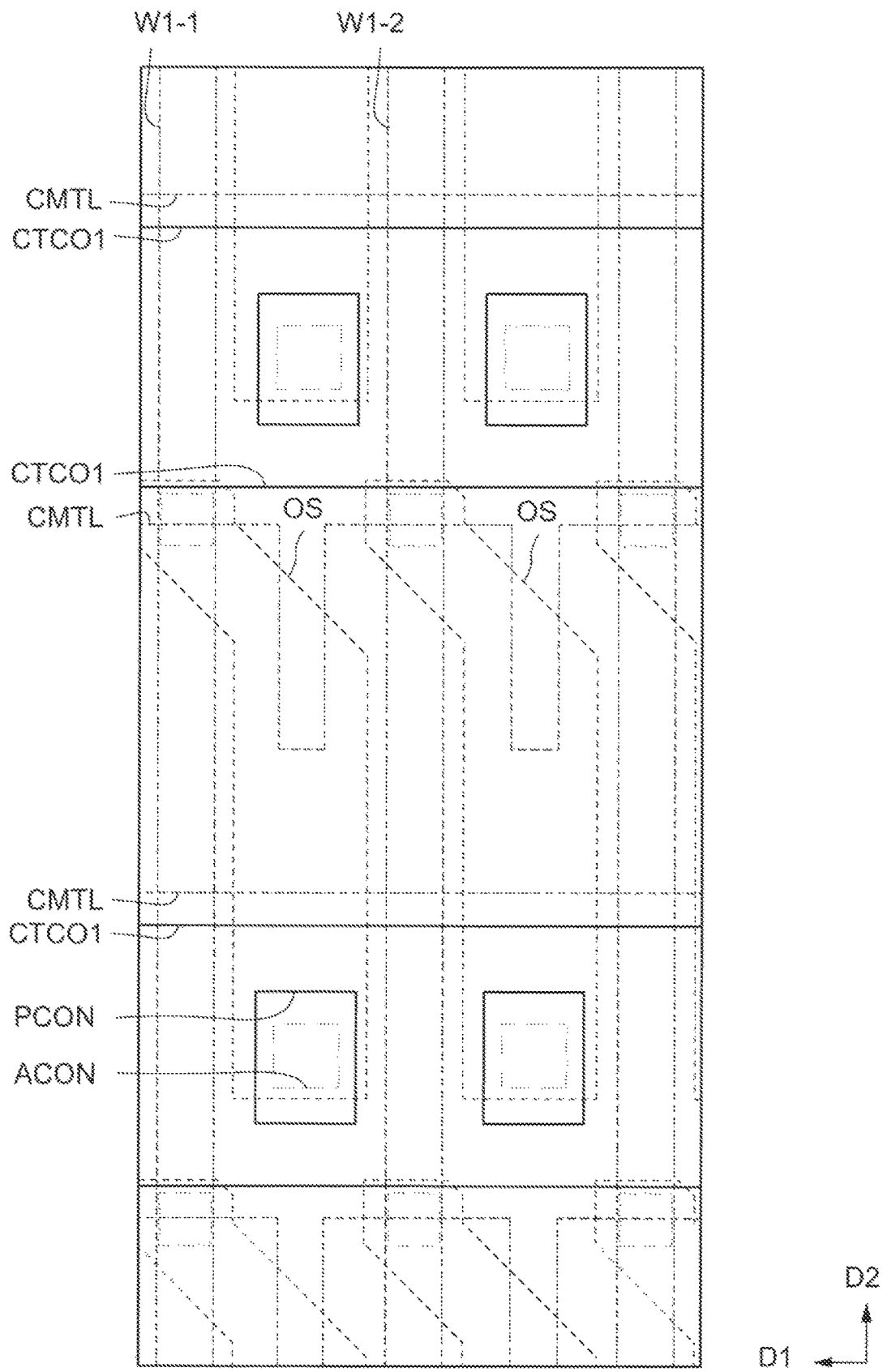
FIG. 11 is a plan view illustrating a layout of each layer in a display device according to an embodiment of the present invention.

As shown in FIG. 11, the common electrode CTCO1 extends along the first direction D1 on the common auxiliary electrode CMTL. The common electrode CTCO1 is provided so as to intersect the wiring W1-1 and the wiring W1-2 extending in the second direction D2. In the present embodiment, although the structure in which the common electrode CTCO1 is provided on the common auxiliary electrode CMTL is described, an embodiment of the present invention is not limited to this. The common auxiliary electrode CMTL may be provided on the common electrode CTCO1.

Figure 12:
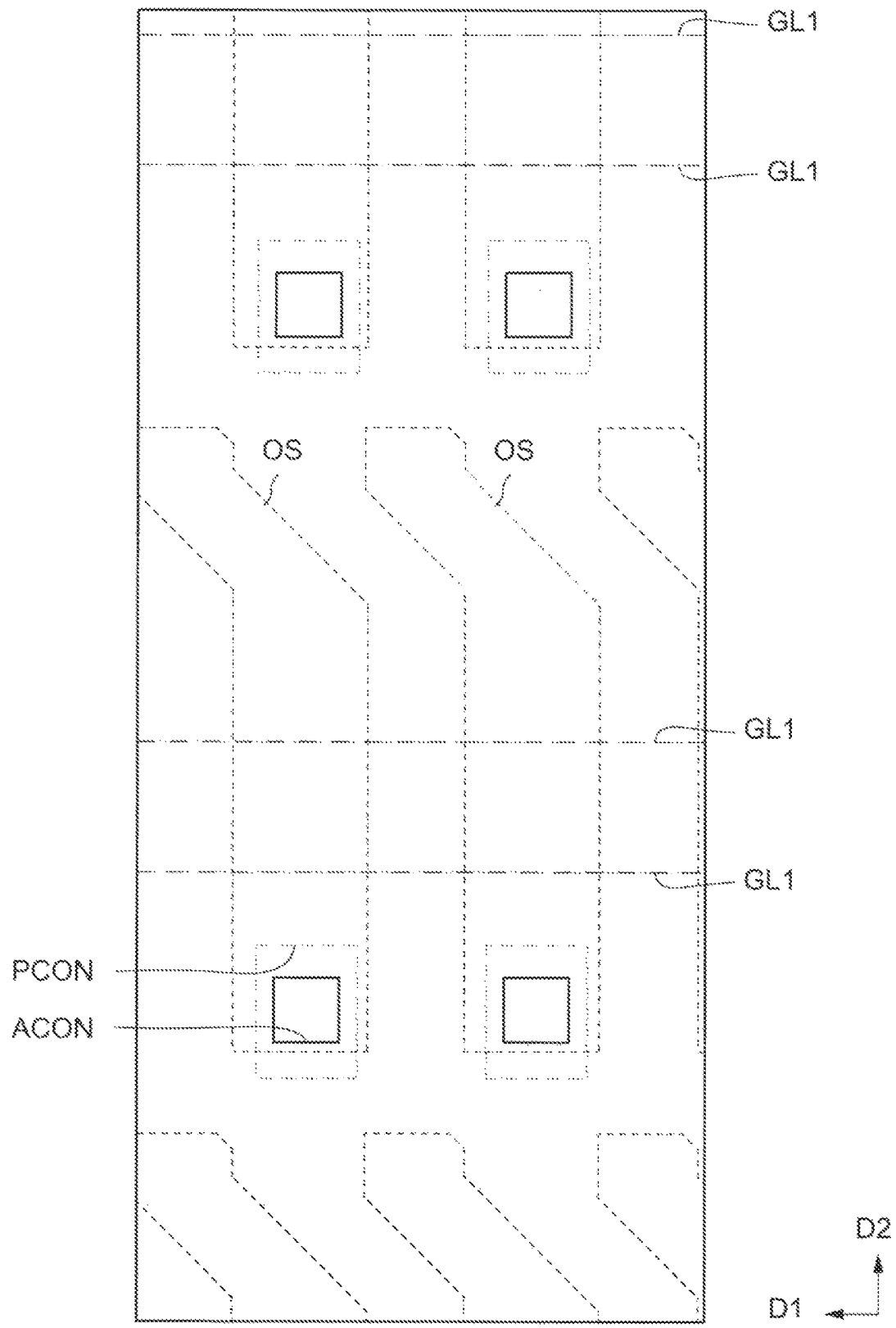
FIG. 12 is a plan view illustrating a layout of each layer in a display device according to an embodiment of the present invention.

FIG. 12 shows the opening PCON provided in the insulating layer IL4. The insulating layer IL5 is provided on the side wall of the opening PCON.

Figure 13:
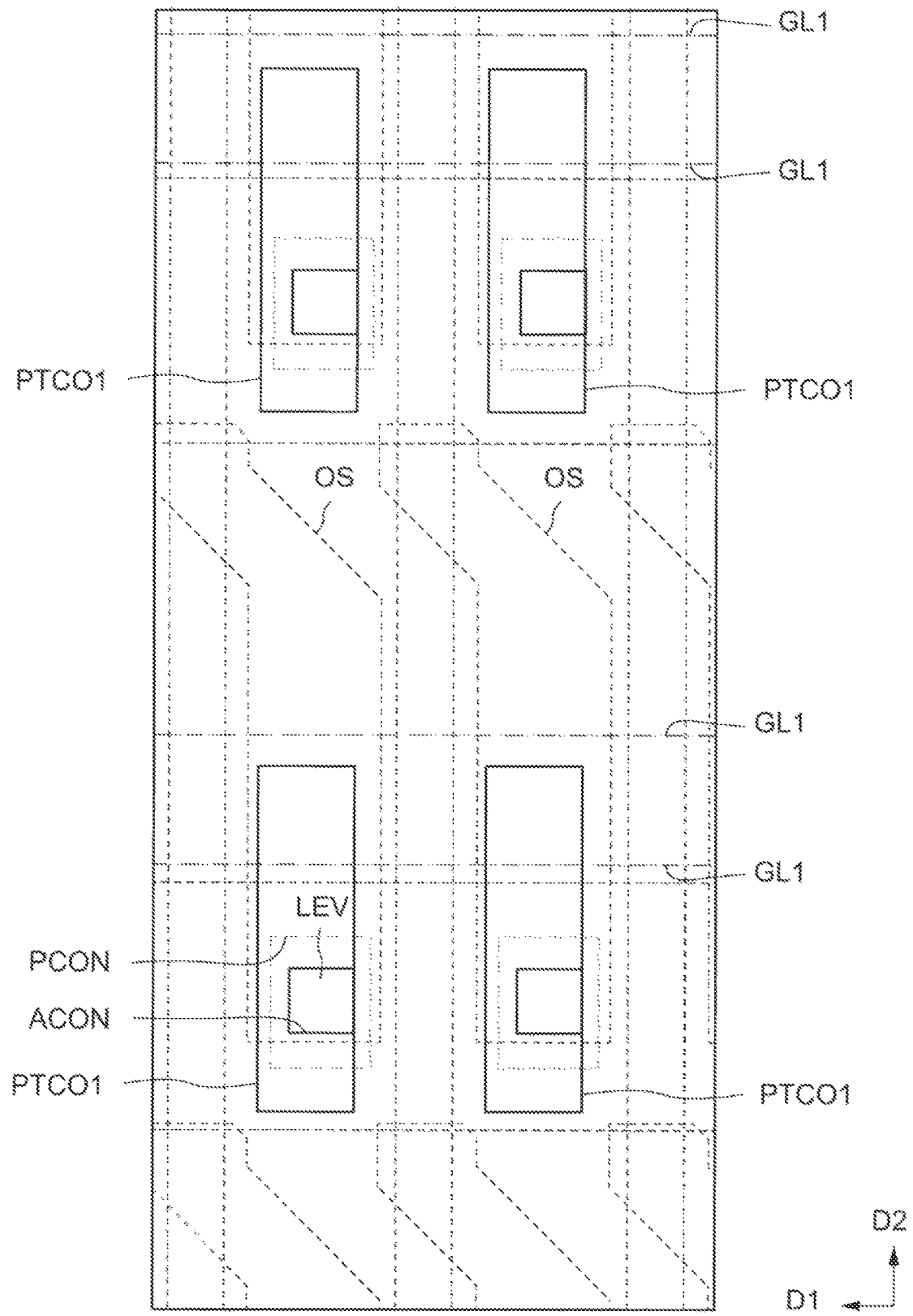
FIG. 13 is a plan view illustrating a layout of each layer in a display device according to an embodiment of the present invention.

As shown in FIG. 2 and FIG. 13, the pixel electrode PTCO1 extends along the second direction D2. The pixel electrode PTCO1 overlaps the gate electrode GL1 and the oxide semiconductor layer OS. A part where the pixel electrode PTCO1 is in contact with the oxide semiconductor layer OS through the opening ACON and the opening PCON overlapping the gate electrode GL1 is referred to as the first contact area CON1. In addition, the pixel electrode PTCO1 overlaps the common electrode CTCO1 via the insulating layer IL5. An area where the pixel electrode PTCO1 overlaps the common electrode CTCO1 via the insulating layer IL5 functions as the storage capacitor Cs1 (refer to FIG. 1). In addition, the inside of the opening ACON and the opening PCON is filled with the resin layer LEV above the pixel electrode PTCO1. A surface of the resin layer LEV is flattened along a surface of the pixel electrode PTCO1.

Figure 14:
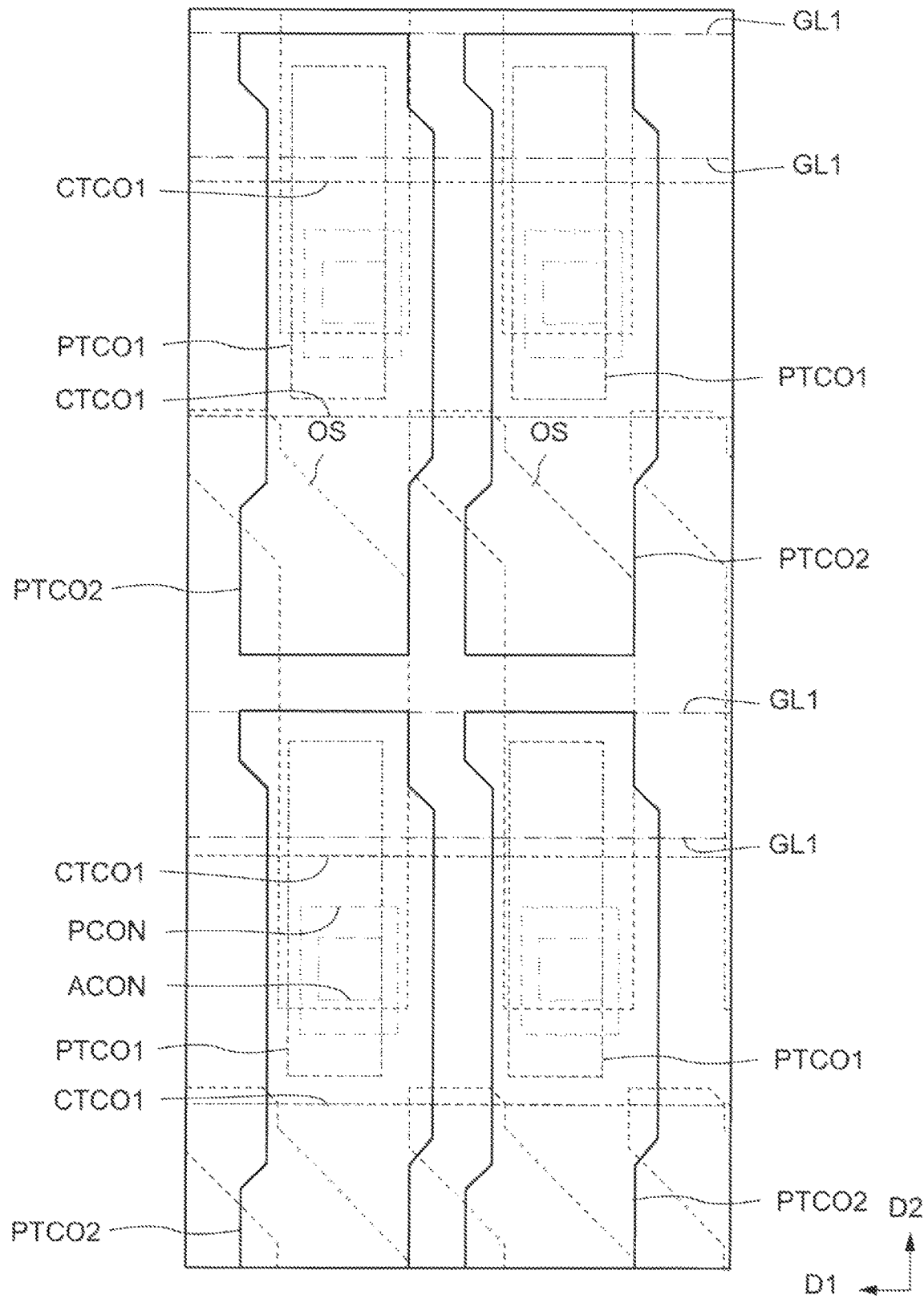
FIG. 14 is a plan view illustrating a layout of each layer in a display device according to an embodiment of the present invention.

As shown in FIG. 2 and FIG. 14, the pixel electrode PTCO2 overlaps the pixel electrode PTCO1 and the resin layer LEV. In other words, the pixel electrode PTCO2 is in direct contact with the resin layer PTCO1 outside the area where the resin layer LEV is provided. The pixel electrode PTCO2 overlaps the gate electrode GL1 and the oxide semiconductor layer OS. The pixel electrode PTCO2 extends along the second direction D2. The area of the pixel electrode PTCO2 is greater than the area of the pixel electrode PTCO1. The insulating layer IL6 is provided above the pixel electrode PTCO2.

Figure 15:
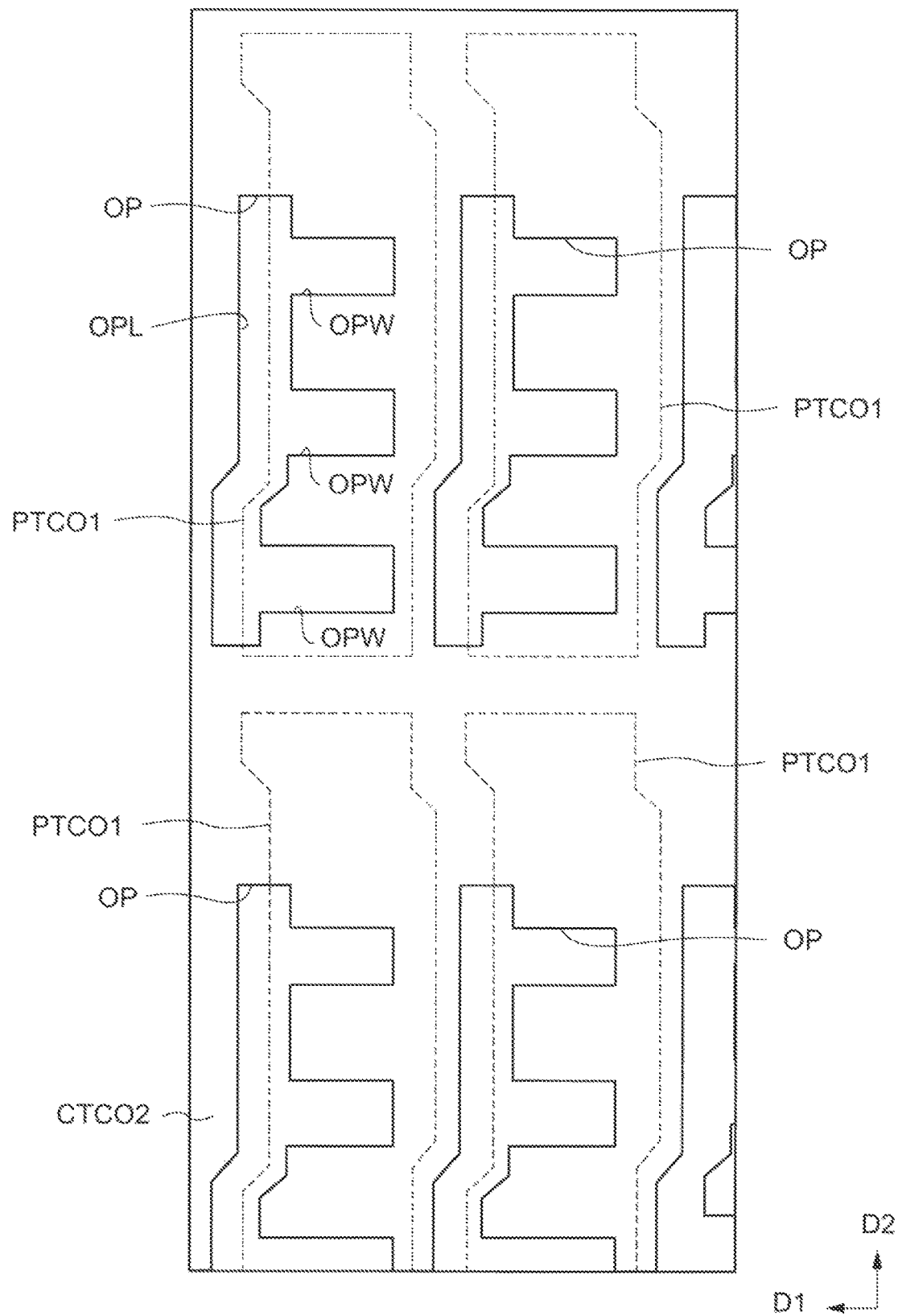
FIG. 15 is a plan view illustrating a layout of each layer in a display device according to an embodiment of the present invention.

As shown in FIG. 2 and FIG. 15, the common electrode CTCO2 is commonly provided for a plurality of pixels and the opening OP is provided. The opening OP has a plurality of shapes extending in the first direction D1 and has a shape that bends along the bend of the pixel electrode PTCO1 in the second direction D2. More specifically, the opening OP has three lateral openings OPW extending in the D1 direction and a vertical opening OPL extending in the D2 direction, and the vertical opening OPL and one end (left end in FIG. 15) of the three lateral openings OPW are connected. In addition, an outer edge of the pixel electrode PTCO1 overlaps the vertical opening OPL, so that a part of the vertical opening OPL (left end side in FIG. 15) does not overlap the pixel electrode PTCO1. In this case, the common electrode CTCO2 overlaps the pixel electrodes PTCO1 and PTCO2 via the insulating layer IL6. The area where the common electrode CTCO2 overlaps the pixel electrodes PTCO1 and PTCO2 via the insulating layer IL6 functions as the storage capacitor Cs2 (refer to FIG. 1).

A transistor using an oxide semiconductor layer for the channel is used as the transistor Tr1 of the pixel circuit in the display device according to an embodiment of the present invention. The inside of the contact hole ACON and the contact hole PCON for connecting the oxide semiconductor layer and the pixel electrode PTCO1 is filled with the resin layer LEV. In addition, the surface of the resin layer LEV is flattened along the surface of the pixel electrode PTCO1. Therefore, unevenness caused by the contact hole ACON and the contact hole PCON is reduced, the control of liquid crystal molecules in the contact hole is improved, and the aperture ratio (transmittance) of the pixel can be improved.

[1-5. Material of Each Member of Display Device 10]

A rigid substrate having light transmittance and having no flexibility, such as a glass substrate, a quartz substrate, and a sapphire substrate, can be used as the substrate SUB. On the other hand, when the substrate SUB is to have flexibility, a flexible substrate containing a resin, such as a polyimide substrate, an acrylic substrate, a siloxane substrate, or a fluororesin substrate, can be used as the substrate SUB. Impurities may be added into the above-described resin in order to improve the heat resistance of the substrate SUB.

A common electrode material may be used for the gate electrodes GL1 and GL2, the wirings W1 and W2, the light-shielding layer LS, and the common electrode CMTL. For example, aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag), and an alloy or a compound thereof are used for the members. The above-described materials may be used in a single layer or in a stacked layer as the above-described members.

For example, a stacked structure of Ti/Al/Ti is used as the gate electrode GL1. In the present embodiment, the cross-sectional shape of pattern end of the gate electrode GL1 of the stacked structure is a forward tapered shape.

A common insulating layer materials can be used as the gate insulating layers GI1 and GI2 and the insulating layers IL1 to IL6. For example, an inorganic insulating layer such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), and aluminum nitride ($AlN_x$) can be used as the insulating layers IL1 to IL3, IL5, and IL6. An insulating layer with few defects can be used for these insulating layers. An organic insulating material such as a polyimide resin, an acrylic resin, an epoxy resin, a silicone resin, a fluororesin, or a siloxane resin can be used as the insulating layer IL4 and the resin layer LEV. In this case, it is preferred to use the same organic insulating material for the insulating layer IL4 and the resin layer LEV. Also, the above-described organic insulating materials may be used as the gate insulating layers GI1 and GI2, and the insulating layers IL1 to IL3, IL5, and IL6. The above-described materials may be used in a single layer or in a stacked layer as the members.

Also, $SiO_x$ with a thickness of 100 nm is used as the gate insulating layer GI1 as an example of the above-described insulating layer. In addition, a stacked structure of $SiO_x$/$SiN_x$/$SiO_x$ with a total thickness of 600 nm to 700 nm is used as the insulating layer IL1. A stacked structure of $SiO_x$/$SiN_x$ with a total thickness of 60 nm to 100 nm is used as the gate insulating layer GI2. A stacked structure of $SiO_x$/$SiN_x$/$SiO_x$ with a total thickness of 300 nm to 500 nm is used as the insulating layer IL2. $SiO_x$ (single layer) or $SiN_x$ (single layer) with a total thickness of 200 nm to 500 nm, or a stacked layer thereof is used as the insulating layer IL3. An organic layer with a thickness of 2 µm to 4 µm is used as the insulating layer IL4. A $SiN_x$ (single layer) with a thickness of 50 nm to 150 nm is used as the insulating layer IL5. $SiN_x$ (single layer) with a thickness of 50 nm to 150 nm is used as the insulating layer IL6.

The above-described $SiO_xN_y$ and $AlO_xN_y$ are silicon compounds and aluminum compounds containing nitrogen (N) in a smaller proportion (x>y) than oxygen (O). In addition, $SiN_xO_y$ and $AlN_xO_y$ are silicon compounds and aluminum compounds containing oxygen in a smaller proportion (x>y) than nitrogen.

A metal oxide with semiconducting properties can be used as the oxide semiconductor layer OS. The oxide semiconductor layer OS has light transmittance. For example, an oxide semiconductor containing indium (In), gallium (Ga), zinc (Zn), and oxygen (O) can be used. In particular, an oxide semiconductor having a composition ratio of In:Ga:Zn:O=1:1:1:4 can be used. However, the oxide semiconductor containing In, Ga, Zn, and O used in the present embodiment is not limited to the above-described compositions, and an oxide semiconductor having a composition different from the above can also be used. For example, the ratio of In may be made larger than the above ratio in order to improve the mobility. In addition, the ratio of Ga may be made larger than the above ratio in order to increase the bandgap and reduce the influence of light irradiation.

Other elements may be added to the oxide semiconductor containing In, Ga, Zn, and O. For example, a metal element such as Al or Sn may be added to the oxide semiconductor. In addition to the oxide semiconductor described above, an oxide semiconductor (IGO) containing In and Ga, an oxide semiconductor (IZO) containing In and Zn, an oxide semiconductor (ITZO) containing In, Sn, and Zn, and an oxide semiconductor containing In and W may be used as the oxide semiconductor layer OS. The oxide semiconductor layer OS may be amorphous or crystalline. The oxide semiconductor layer OS may be a mixed phase of amorphous and crystalline.

A transparent conductive layer is used as the common electrodes CTCO1 and CTCO2, and the pixel electrodes PTCO1 and PTCO2. A mixture (ITO) of indium oxide and tin oxide and a mixture (IZO) of indium oxide and zinc oxide can be used as the transparent conductive layer. A material other than the above may be used as the transparent conductive layer.

As described above, the display device 10 according to the present embodiment, the conduction between the oxide semiconductor layer OS and the pixel electrode PTCO1 can be ensured by directly contacting the oxide semiconductor layer OS with the pixel electrode PTCO1 of the transistor Tr1. Therefore, it is not necessary to provide a metal layer between the oxide semiconductor layer OS and the pixel electrode PTCO1. As a result, the opening ACON and the opening PCON are not shielded from light, so that it is possible to suppress a decrease in the aperture ratio. In addition, the layer exposed to the display area is the oxide semiconductor layer OS having light transmittance and unevenness of transmitted light is unlikely to occur like a silicon layer, so that it is possible to suppress the occurrence of display unevenness.

The display device 10 can provide good image quality because it is possible to increase the storage capacitor by overlapping the capacitance by the storage capacitor Cs1 and the storage capacitor Cs2. In addition, it is possible to suppress the water from diffusing from the lower layer by overlapping the capacitance by the storage capacitor Cs1 and the storage capacitor Cs2.

In addition, the pixel electrode is more susceptible to capacitive coupling due to a signal line as the pixel size of the display device is reduced. When trying to drive the reduced pixel at high speed, the influence of crosstalk in which the potential of the pixel electrode changes depending on the potential of the signal line may be apparent.

In the display device 10 according to an embodiment of the present invention, the common electrode CTCO1 is provided so as to intersect the wiring W1-1 and the wiring W1-2 extending in the second direction D2. The common electrode CTCO1 is provided along the first direction D1 so as to cross the plurality of pixels. As a result, the area between the wirings W1-1, W1-2 and the pixel electrode can be shielded by the common electrode CTCO1. Therefore, it is possible to reduce the capacitive coupling between the wirings W1-1 and W1-2 and the pixel electrode. In addition, in the display area of the pixel, it is possible to add the storage capacitor formed of the pixel electrode PTCO1, the insulating layer IL5, and the common electrode CTCO1 to the storage capacitor formed of the pixel electrode PTCO1, the insulating layer IL6, and the common electrode CTCO2. As a result, the storage capacitor can be increased, so that the influence of the potential due to the capacitive coupling can be reduced. As described above, in the display device 10, the effect of the potential due to the capacitive coupling can be reduced in the reduced pixel, so that it is possible to reduce crosstalk.

In addition, as shown in FIG. 13, the width of the pixel electrode PTCO1 in the first direction D1 may substantially coincide with the width of the opening PCON in the first direction D1, may be smaller than the width of the opening PCON in the first direction D1, or may be larger than the width of the opening PCON in the first direction D1. In addition, the width of the pixel electrode PTCO1 in the first direction D1 is preferably larger than the width of the opening ACON in the first direction D1. The arrangement of the pixel electrode PTCO1 is shifted in the first direction D1 with respect to the arrangement of the opening PCON. In other words, there may be an area where the insulating layer IL5 is not in contact with the pixel electrode PTCO1 in the opening PCON. That is, the pixel electrode PTCO1 may be in contact with the insulating layer IL5 provided in the opening PCON. Since the arrangement of the pixel electrode PTCO1 is shifted in the first direction D1 with respect to the arrangement of the opening PCON, it is possible to suppress the pixel electrode PTCO1 from being divided by the opening PCON in the second direction D2. As a result, the potential applied to the pixel electrode PTCO1 can be made uniform.

Figure 16:
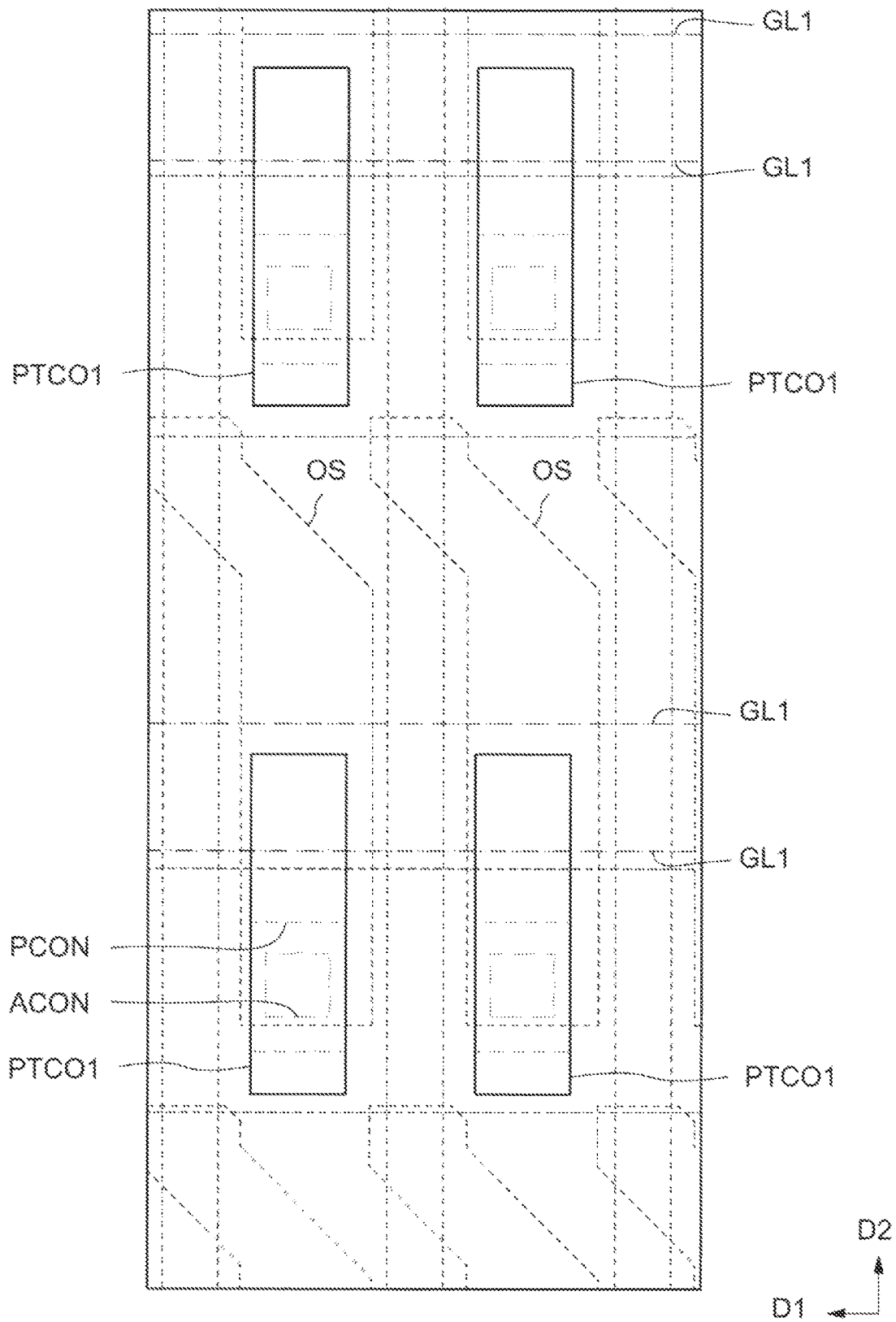
FIG. 16 is a plan view illustrating a layout of each layer in a display device according to an embodiment of the present invention.

Also, as shown in FIG. 16, the arrangement of the pixel electrode PTCO1 may not be shifted in the first direction D1 with respect to the arrangement of the opening PCON. In other words, there may be a plurality of areas where the insulating layer IL5 is not in contact with the pixel electrode PTCO1 in the opening PCON. That is, the pixel electrode PTCO1 may include a plurality of areas in contact with the insulating layer IL5 provided in the opening PCON.

2. Second Embodiment

The entire structure of a display device 20 described in the first embodiment will be described with reference to FIG. 17 to FIG. 19.

[2-1. Outline of Display Device 20]

Figure 17:
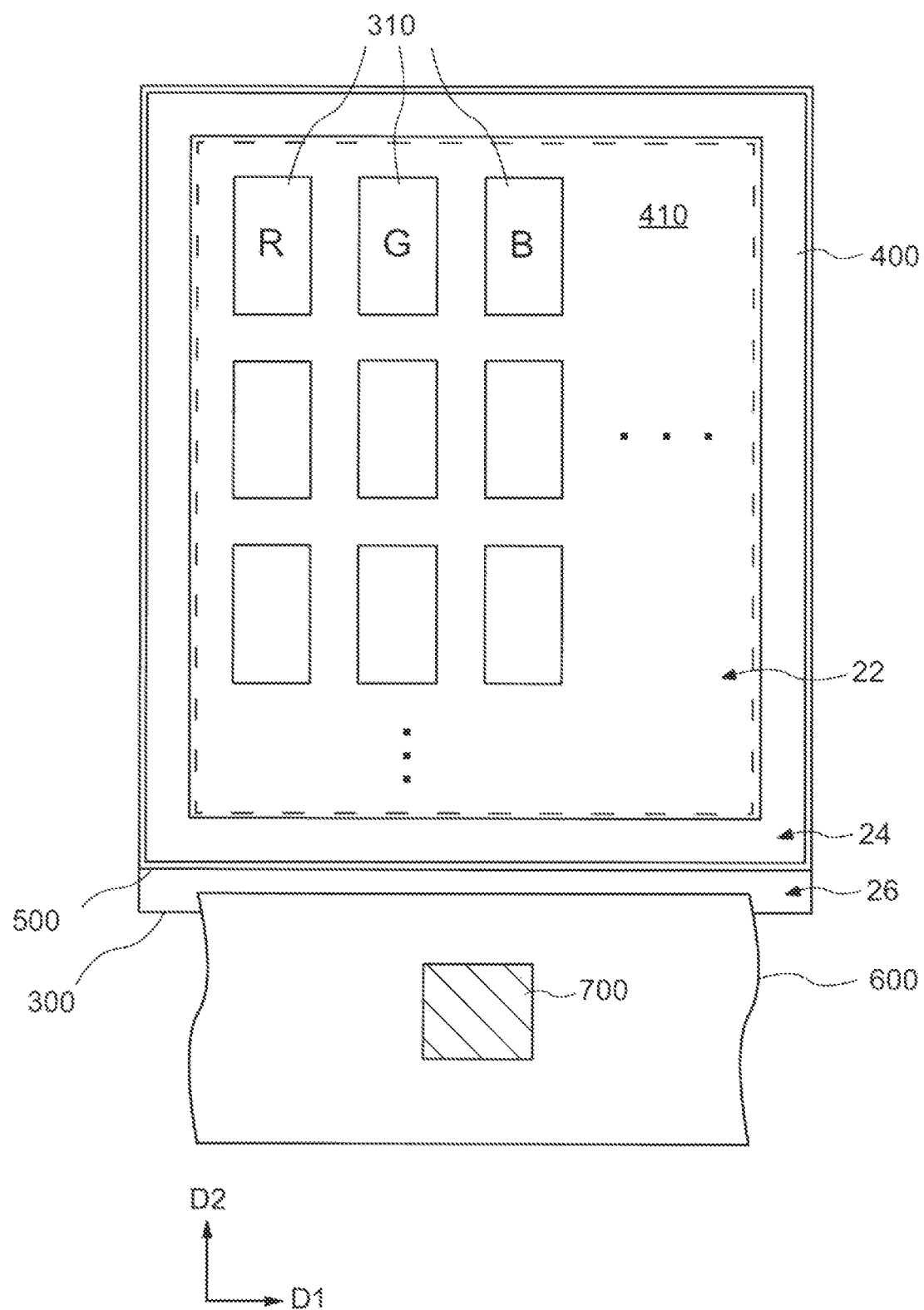
FIG. 17 is a plan view showing an outline of a display device according to an embodiment of the present invention.

FIG. 17 is a plan view showing an outline of the display device 20 according to an embodiment of the present invention. As shown in FIG. 17, the display device 20 includes an array substrate 300, a seal part 400, a counter substrate 500, a flexible printed circuit board 600 (FPC 600), and an IC chip 700. The array substrate 300 and the counter substrate 500 are bonded together by the seal part 400. A plurality of pixel circuits 310 is arranged in a matrix in a liquid crystal area 22 surrounded by the seal part 400. The liquid crystal area 22 is an area overlapping a liquid crystal element 410, which will be described later, in a plan view.

A seal area 24 provided with the seal part 400 is an area around the liquid crystal area 22. The FPC 600 is provided in a terminal area 26. The terminal area 26 is an area where the array substrate 300 is exposed from the counter substrate 500 and is provided outside the seal area 24. Also, the outside of the seal area 24 means the outside of the area where the seal part 400 is provided and the area surrounded by the seal part 400. The IC chip 700 is provided on the FPC 600. The IC chip 700 supplies a signal for driving each pixel circuit 310.

[2-2. Circuit Configuration of Display Device 20]

Figure 18:
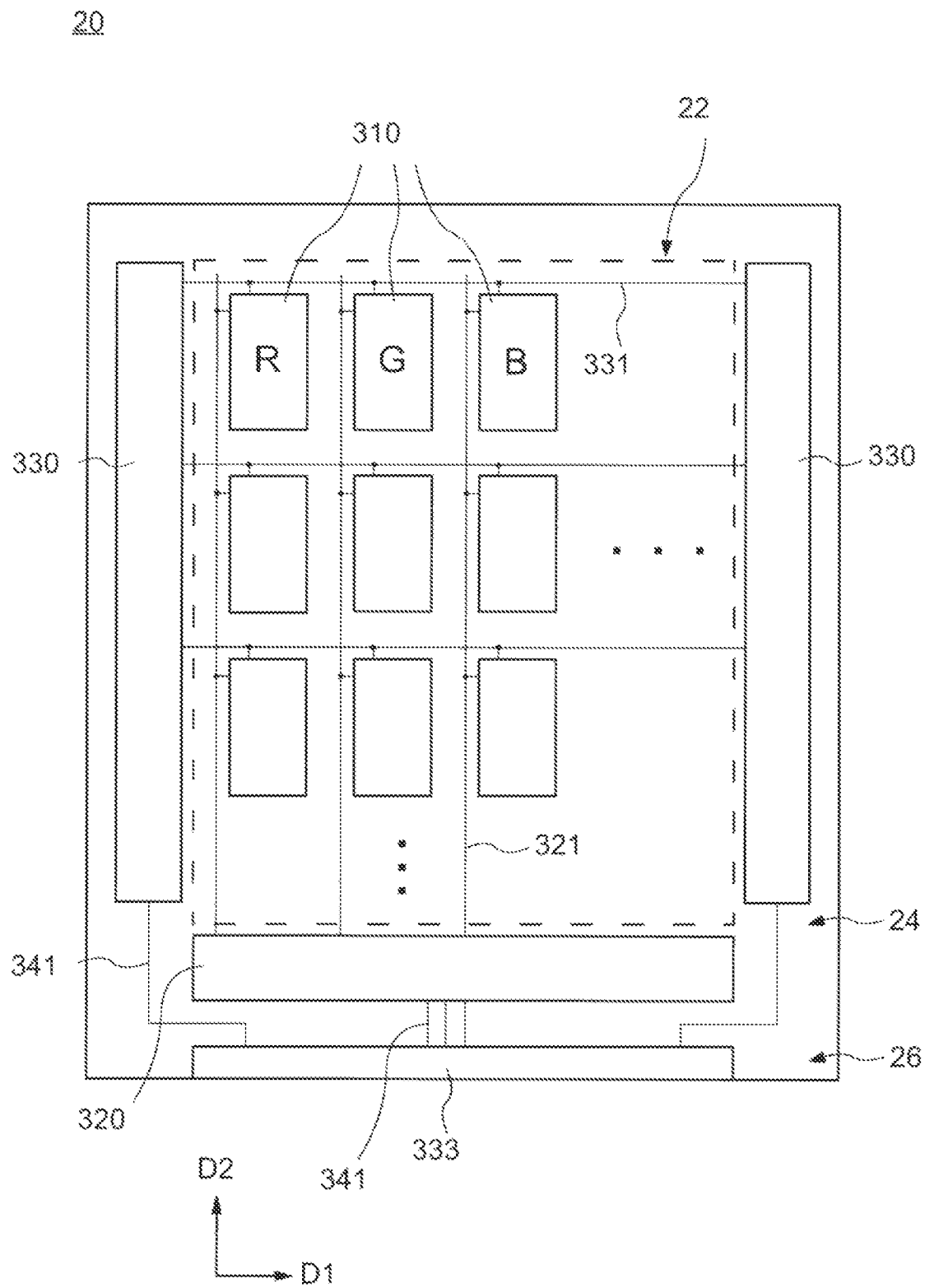
FIG. 18 is a diagram showing a circuit configuration of a display device according to an embodiment of the present invention.

FIG. 18 is a block diagram showing a circuit configuration of a display device according to an embodiment of the present invention. As shown in FIG. 18, a source driver circuit 320 is provided at a position adjacent to the liquid crystal area 22 in which the pixel circuit 310 is arranged in the first direction D1 (row direction). In addition, a gate driver circuit 330 is provided at a position adjacent to the liquid crystal area 22 in the second direction D2 (column direction). The source driver circuit 320 and the gate driver circuit 330 are provided in the seal area 24. However, the area where the source driver circuit 320 and the gate driver circuit 330 are provided is not limited to the seal area 24 and may be any area as long as it is outside the area where the pixel circuit 310 is provided.

A source wiring 321 extends from the source driver circuit 320 in the second direction D2 and is connected to the plurality of pixel circuits 310 arranged in the second direction D2. A gate wiring 331 extends from the gate driver circuit 330 in the first direction D1 and is connected to the plurality of pixel circuits 310 arranged in the first direction D1.

A terminal part 333 is provided in the terminal area 26. The terminal part 333 and the source driver circuit 320 are connected by a connecting wiring 341. Similarly, the terminal part 333 and the gate driver circuit 330 are connected by the connecting wiring 341. When the FPC 600 is connected to the terminal part 333, an external device to which the FPC 600 is connected is connected to the display device 20, and each pixel circuit 310 provided in the display device 20 is driven by a signal from the external device.

The transistor Tr1 described in the first embodiment and the second embodiment is used in the pixel circuit 310. The transistor Tr2 described in the first embodiment and the second embodiment is applied to the transistor included in the source driver circuit 320 and the gate driver circuit 330.

[2-3. Pixel Circuit 310 in Display Device 20]

Figure 19:
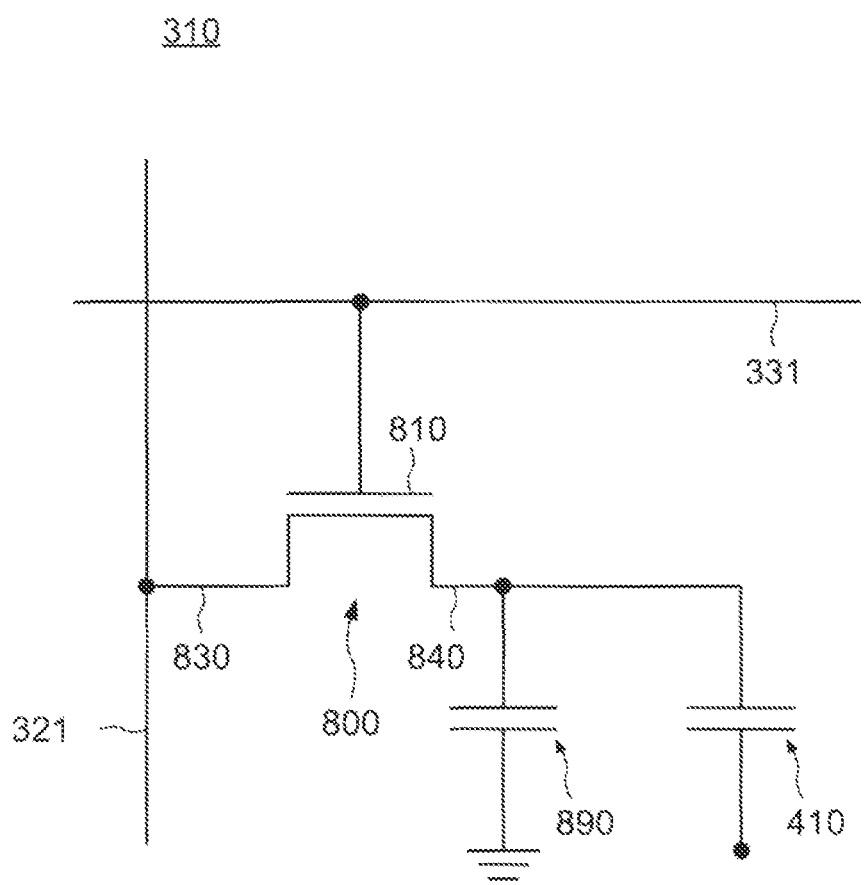
FIG. 19 is a circuit diagram showing a pixel circuit of a display device according to an embodiment of the present invention.

FIG. 19 is a circuit diagram showing a pixel circuit of the display device 20 according to an embodiment of the present invention. As shown in FIG. 19, the pixel circuit 310 includes a transistor 800, a storage capacitor 890, and an element such as the liquid crystal element 410. The transistor 800 includes a first gate electrode 810, a first source electrode 830, and a first drain electrode 840. The first gate electrode 810 is connected to the gating wiring 331. The first source electrode 830 is connected to the source wiring 321. The first drain electrode 840 is connected to the storage capacitor 890 and the liquid crystal element 410. The transistor Tr1 shown in the first embodiment and the second embodiment is applied to the transistor 800 shown in FIG. 19. Also, in the present embodiment, for convenience of explanation, although 830 is referred to as a source electrode, and 840 is referred to as a drain electrode, the function as a source and the function as a drain of each electrode may be interchanged.

Each of the embodiments described above as an embodiment of the present invention can be appropriately combined and implemented as long as no contradiction is caused. Further, the addition, deletion, or design change of components, or the addition, deletion, or condition change of processes as appropriate by those skilled in the art based on the display device of each embodiment are also included in the scope of the present disclosure as long as they are provided with the gist of the present disclosure.

Further, it is understood that, even if the effect is different from those provided by each of the above-described embodiments, the effect obvious from the description in the specification or easily predicted by persons ordinarily skilled in the art is apparently derived from the present disclosure.

What is claimed is:

1. A display device comprising:
   a first transistor having an oxide semiconductor layer, a gate wiring opposite the oxide semiconductor layer, a gate insulating layer between the semiconductor layer and the gate wiring;
   a first insulating layer including at least one insulating layer on the first transistor and having a first contact hole outside the gate wiring;
   a planarization film on the first insulating layer and having a second contact hole overlapping the first contact hole;
   a first transparent conductive layer on the planarization film and including an area overlapping the gate wiring;
   a second insulating layer on the first transparent conductive layer, the second insulating layer covering a side of the second contact hole;
   a second transparent conductive layer on the second insulating layer and in contact with the oxide semiconductor layer through the first and second contact holes;
   a first resin filling the first and second contact holes coated by the second transparent conductive layer; and
   a third transparent conductive layer on the second transparent conductive layer and the first resin.

2. The display device according to claim 1, further comprising:
   a conductive layer between the planarization film and the first transparent conductive layer, a part of the conductive layer overlapping the gate wiring.

3. The display device according to claim 2, wherein the conductive layer has a notch portion overlapping the semiconductor layer.

4. The display device according to claim 1, further comprising:
a conductive layer between the first transparent conductive layer and the second insulating layer, a part of the conductive layer overlapping the gate wiring.

5. The display device according to claim 1, wherein
the third transparent conductive layer is overlapped with the first transparent conductive layer via the second conductive layer.

6. The display device according to claim 1, wherein
a refractive index of the planarization film is substantially the same as a refractive index of the first resin.

7. The display device according to claim 1, further comprising:
a third insulating layer on the third transparent conductive layer; and
a fourth transparent conductive layer on the third insulating layer,
wherein the fourth transparent conductive layer has an opening pattern overlapped with the first resin.

8. The display device according to claim 7, wherein
the fourth transparent conductive layer is overlapped with the first transparent conductive layer, the second transparent conductive layer, and the third transparent conductive layer in a plan view.

9. The display device according to claim 8, wherein
at least a part of the opening pattern does not overlap the third conductive layer.

10. The display device according to claim 9, wherein
the opening pattern has one or more horizontal openings along the first direction and a vertical opening along the second direction connected to the horizontal openings, and a part of the vertical opening does not overlap the third conductive layer.

11. The display device according to claim 1, wherein
the gate wiring is provided along a first direction in a plan view,
the second transparent conductive layer and the third transparent conductive layer are provided along a second direction intersecting the first direction, and
the third transparent conductive layer has an area in contact with the second insulating layer in the second contact hole.

12. The display device according to claim 1, wherein
the third transparent conductive layer is overlapped with the first transparent conductive layer without the second conductive layer.

* * * * *